US012648130B2

(12) United States Patent
Inukai

(10) Patent No.: US 12,648,130 B2
(45) Date of Patent: Jun. 2, 2026

(54) MEMORY DEVICE

(71) Applicant: Kioxia Corporation, Tokyo (JP)

(72) Inventor: Takashi Inukai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 495 days.

(21) Appl. No.: 18/359,531

(22) Filed: Jul. 26, 2023

(65) Prior Publication Data

US 2024/0098983 A1 Mar. 21, 2024

(30) Foreign Application Priority Data

Sep. 16, 2022 (JP) ................................. 2022-148181

(51) Int. Cl.
H10B 12/00 (2023.01)
(52) U.S. Cl.
CPC ........... H10B 12/482 (2023.02); H10B 12/33 (2023.02); H10B 12/485 (2023.02); H10B 12/50 (2023.02)
(58) Field of Classification Search
CPC .... H10B 12/482; H10B 12/485; H10B 12/33; H10B 12/50
See application file for complete search history.

(56) References Cited

U.S. PATENT DOCUMENTS

| | | | |
|---|---|---|---|
| 5,396,450 | A | 3/1995 | Takashima et al. |
| 6,711,050 | B2 | 3/2004 | Sadakata |
| 6,898,102 | B2 | 5/2005 | Keeth |
| 11,094,698 | B2 | 8/2021 | Inaba |
| 11,404,421 | B2 | 8/2022 | Inaba |
| 2020/0090722 | A1* | 3/2020 | Lee ..................... G11C 11/1657 |
| 2020/0321041 | A1* | 10/2020 | Antonyan .......... G11C 13/0026 |
| 2021/0050052 | A1 | 2/2021 | Okamoto et al. |
| 2022/0130832 | A1* | 4/2022 | Tsai ..................... H10B 12/312 |

FOREIGN PATENT DOCUMENTS

| | | |
|---|---|---|
| JP | 3302796 B2 | 7/2002 |
| JP | 2003-242773 A | 8/2003 |
| WO | WO-2019/162802 A1 | 8/2019 |

* cited by examiner

*Primary Examiner* — Edward Chin
(74) *Attorney, Agent, or Firm* — Foley & Lardner LLP

(57) ABSTRACT

According to one embodiment, a memory device includes word lines, bit lines, transistors, capacitors, and a plate line. The transistors include first transistors and second transistors. The first and second transistors are coupled to first and second word lines, respectively. The first and second transistors are arranged to alternate each other in a first direction. The bit lines include first to fourth bit lines arranged sequentially in the first direction. The first and third bit lines are coupled to the other end of the first and second transistors. The second bit line is coupled to the other end of the first transistors and is not coupled to the other end of the second transistors. The fourth bit line is coupled to the other end of the second transistors and is not coupled to the other end of the first transistors.

22 Claims, 26 Drawing Sheets

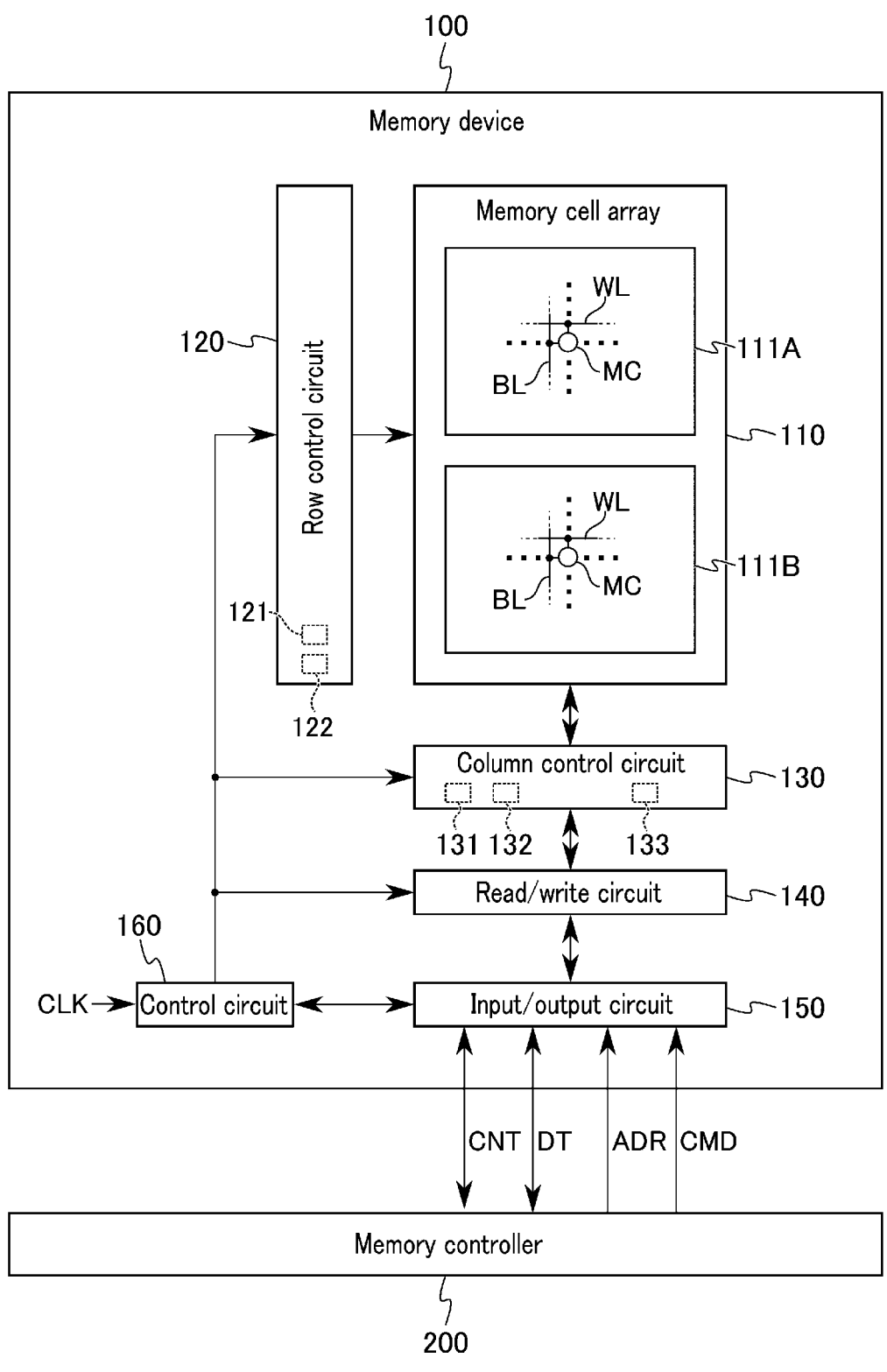
F I G. 1

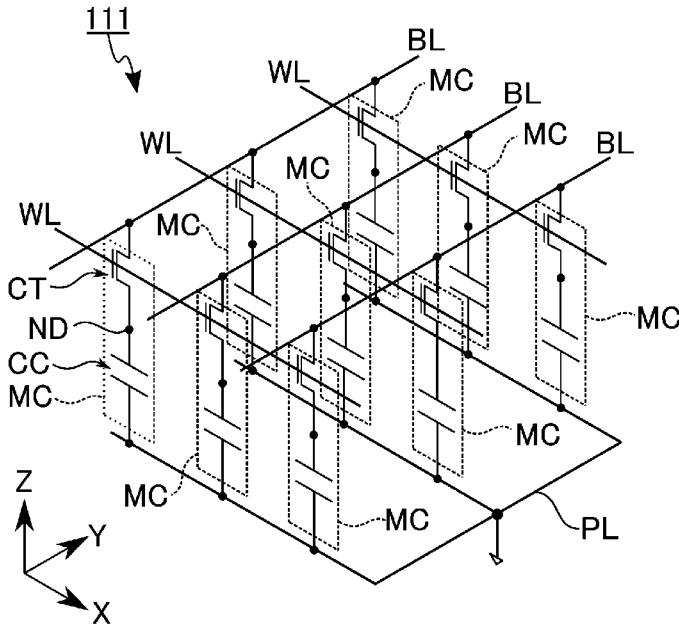
F I G. 2

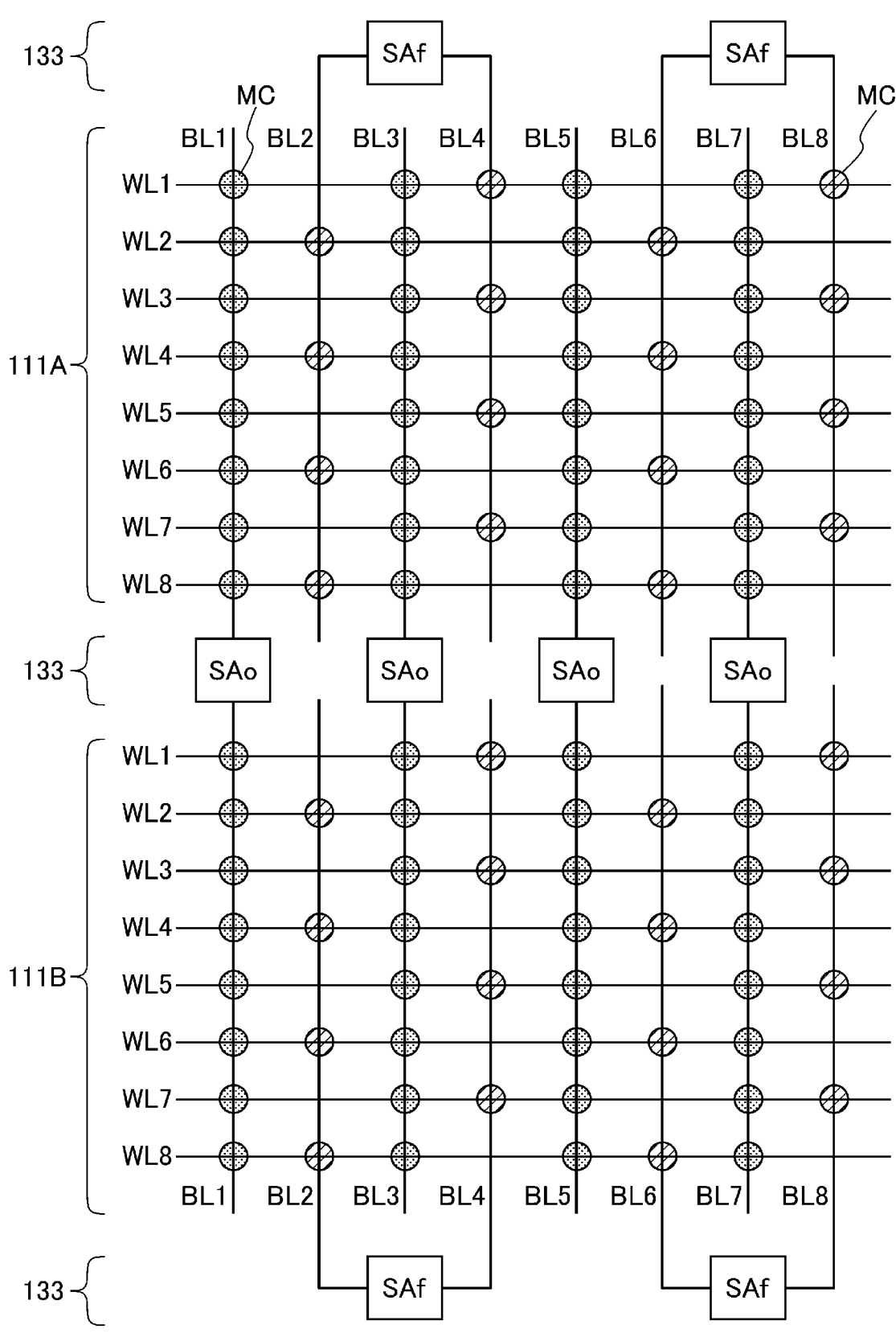
F I G. 3

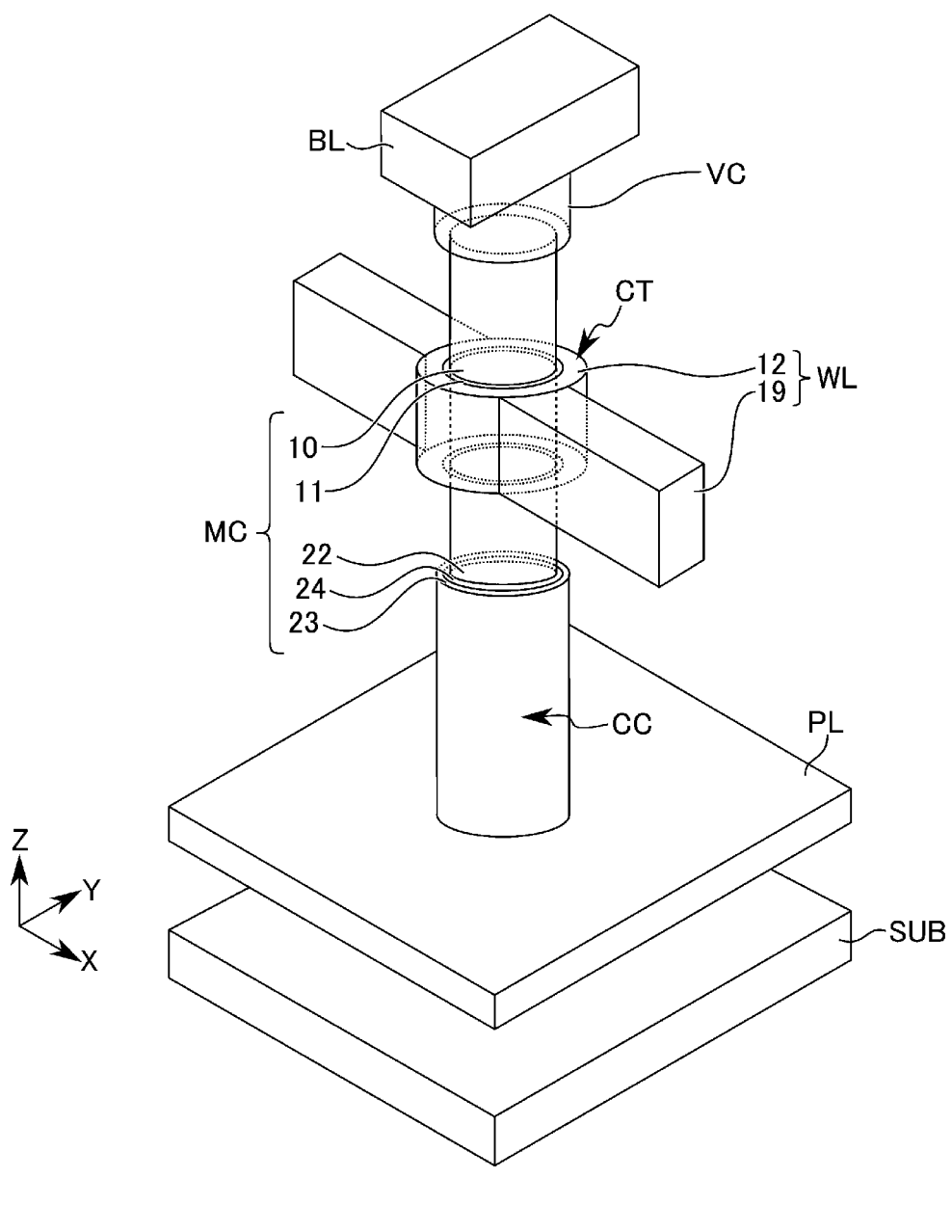
F I G. 4

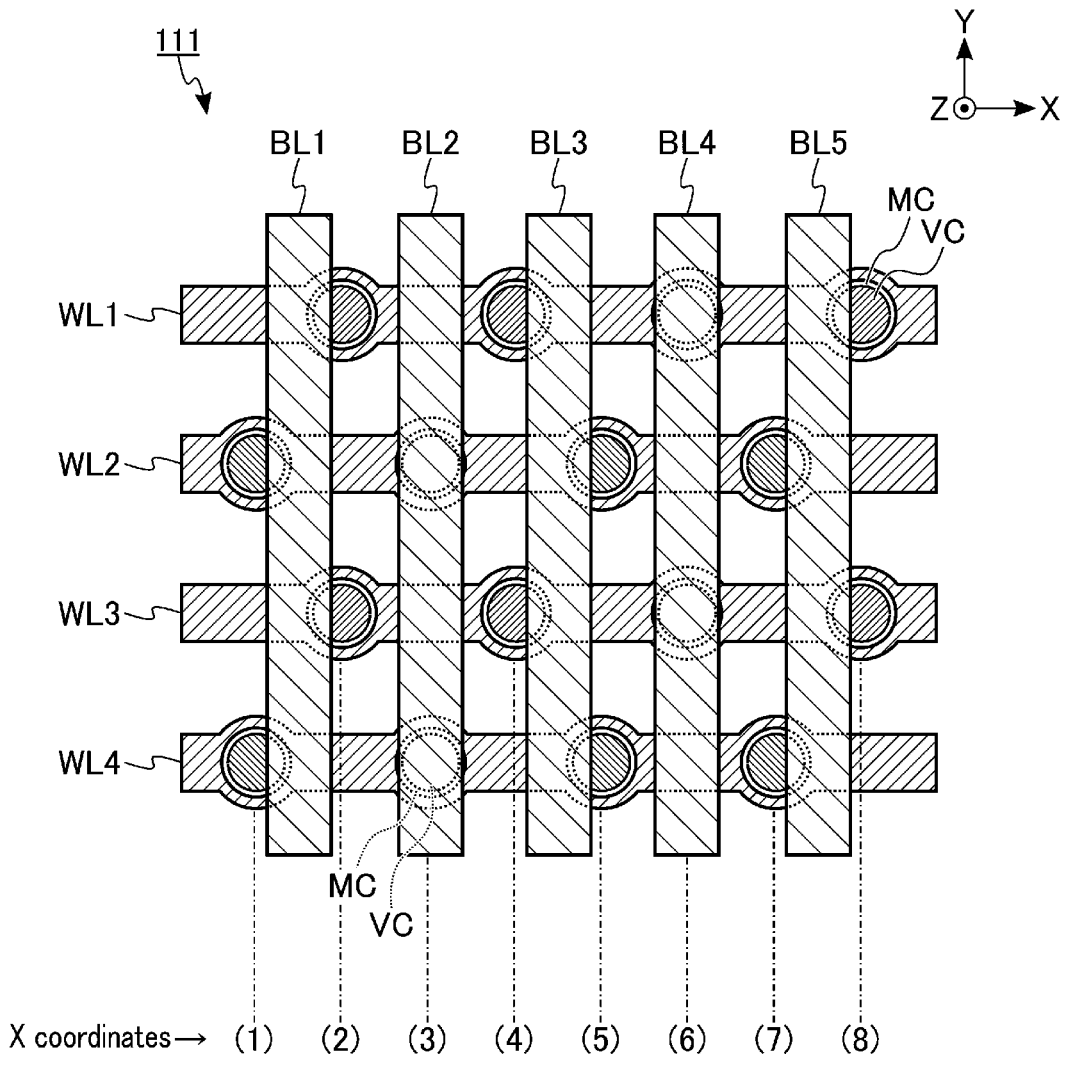
F I G. 5

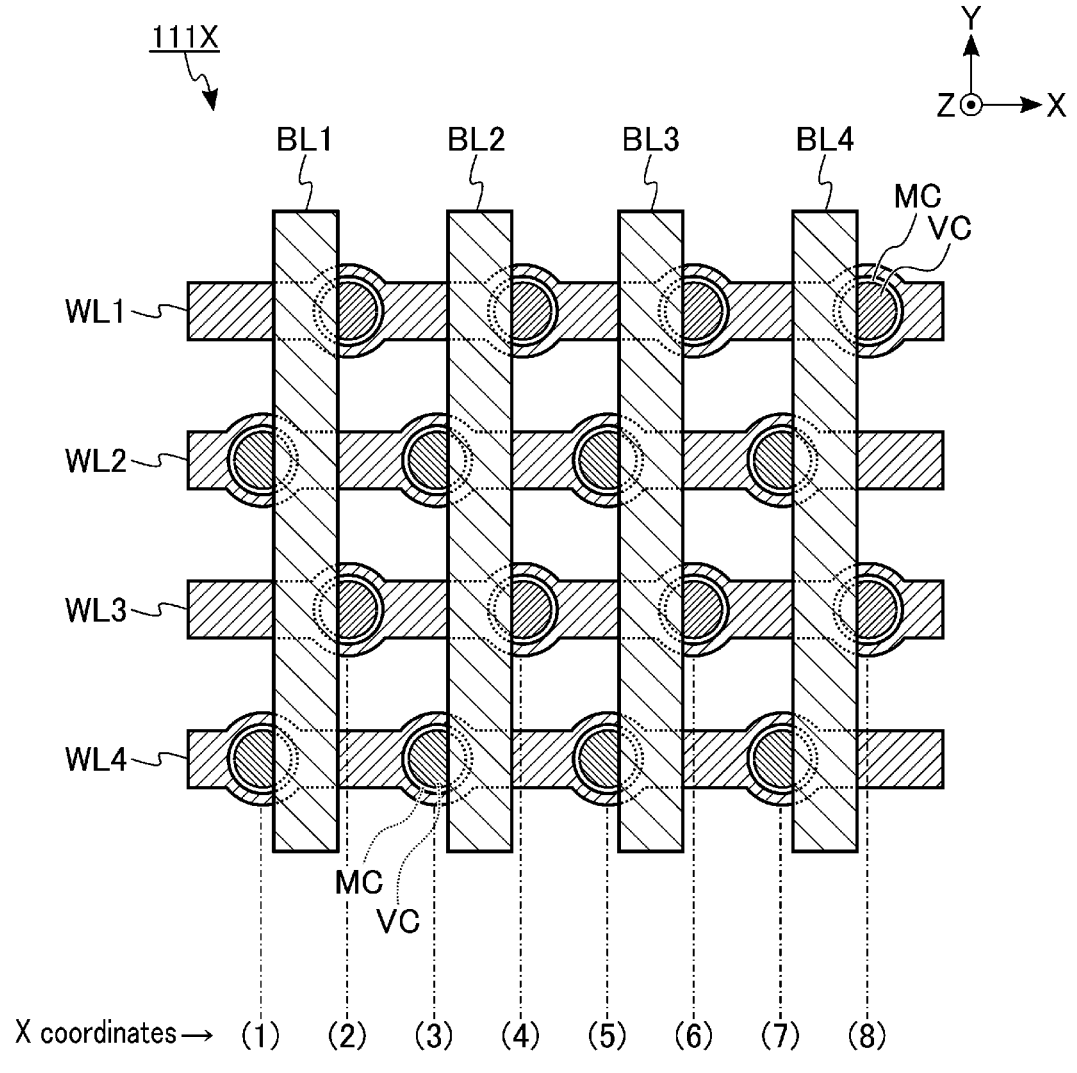
F I G. 6

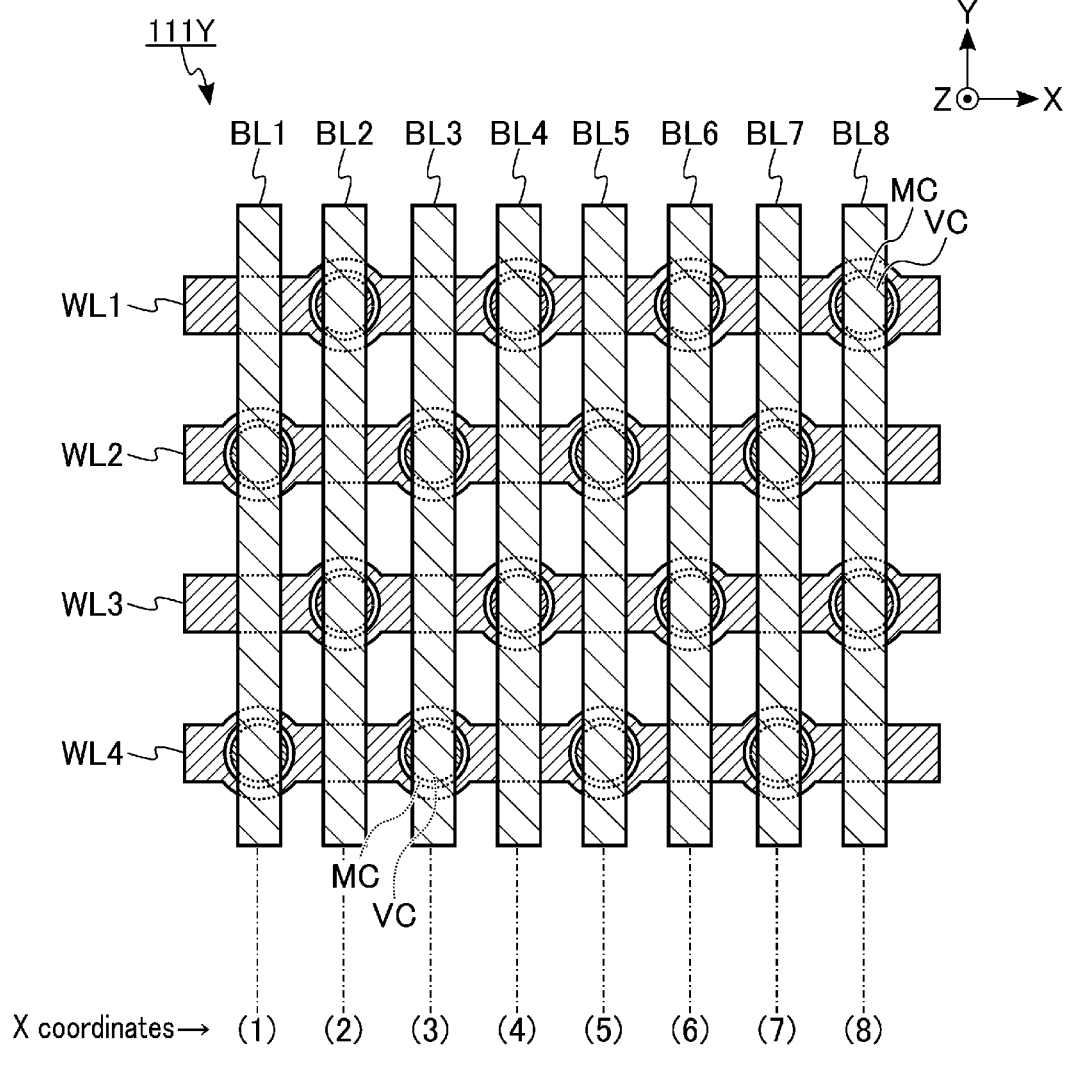
F I G. 7

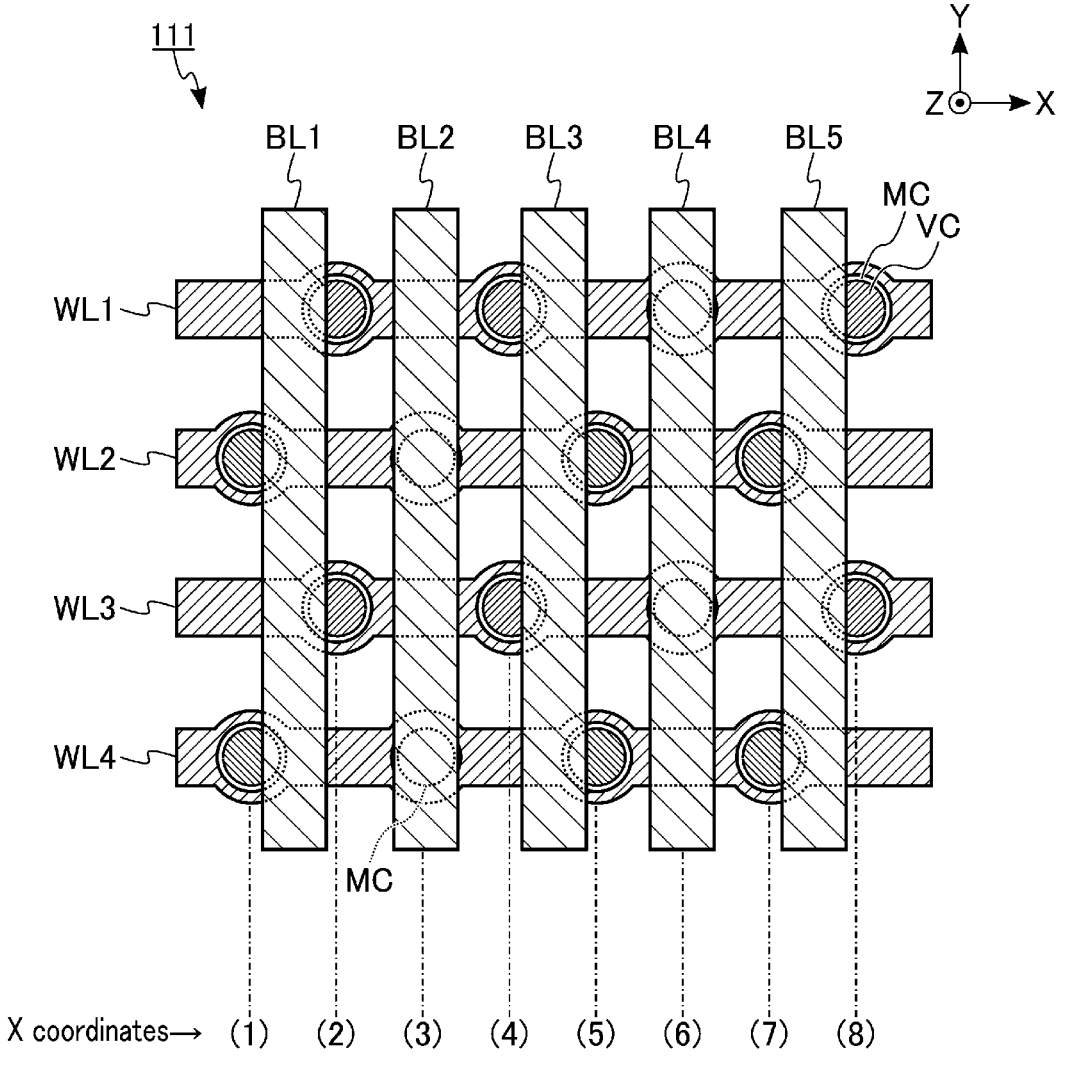
F I G. 9

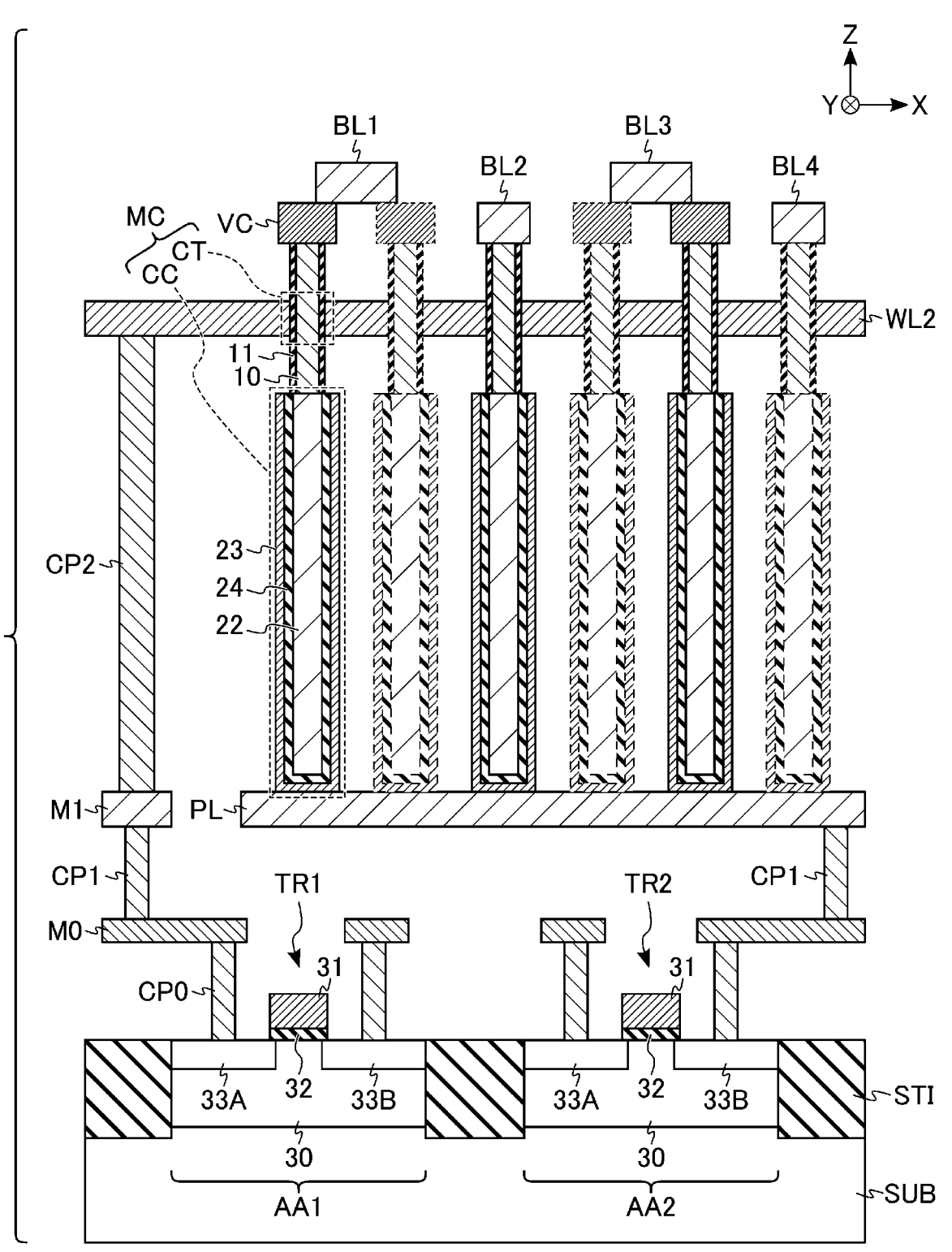
F I G. 10

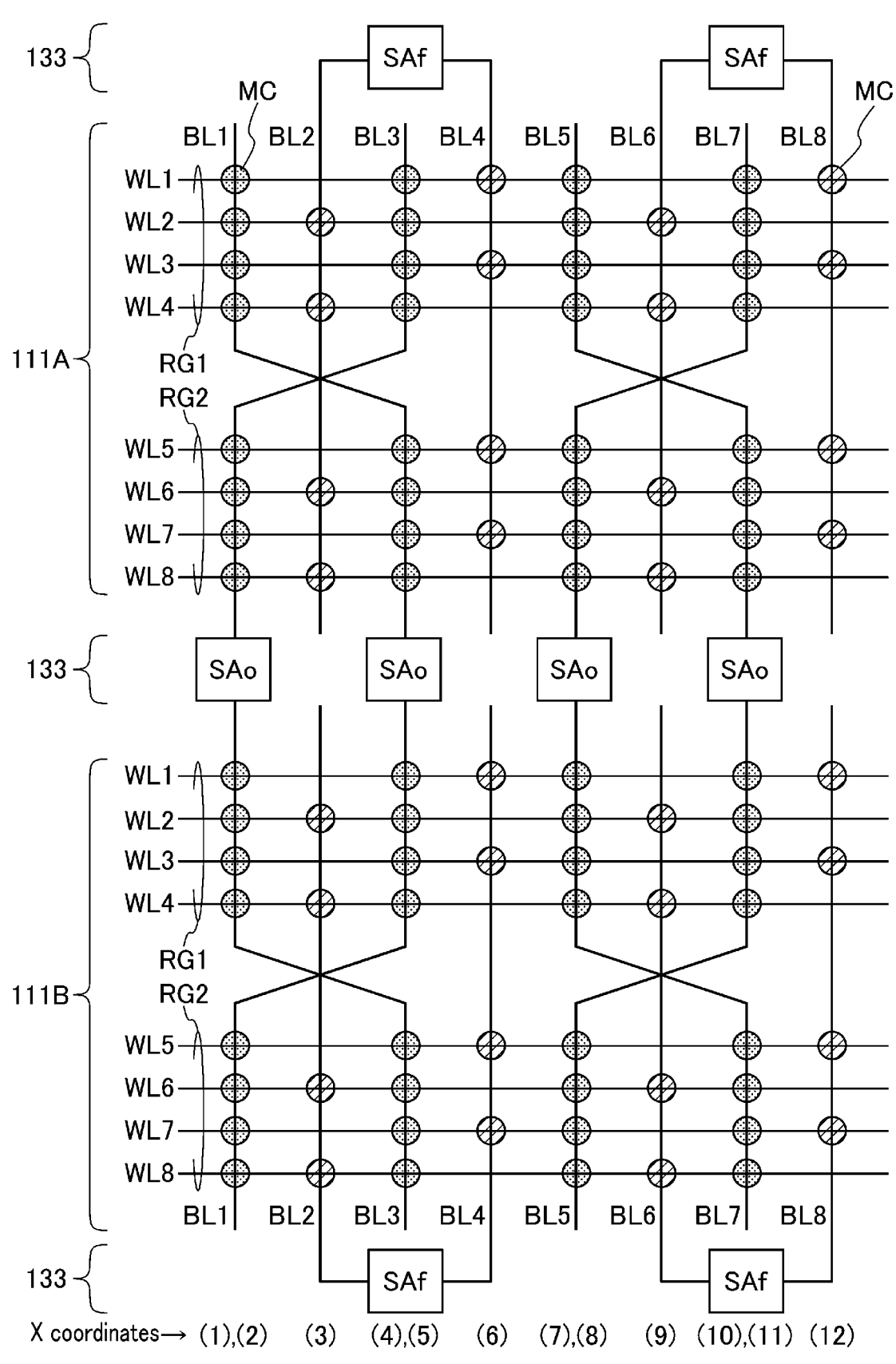
F I G. 11

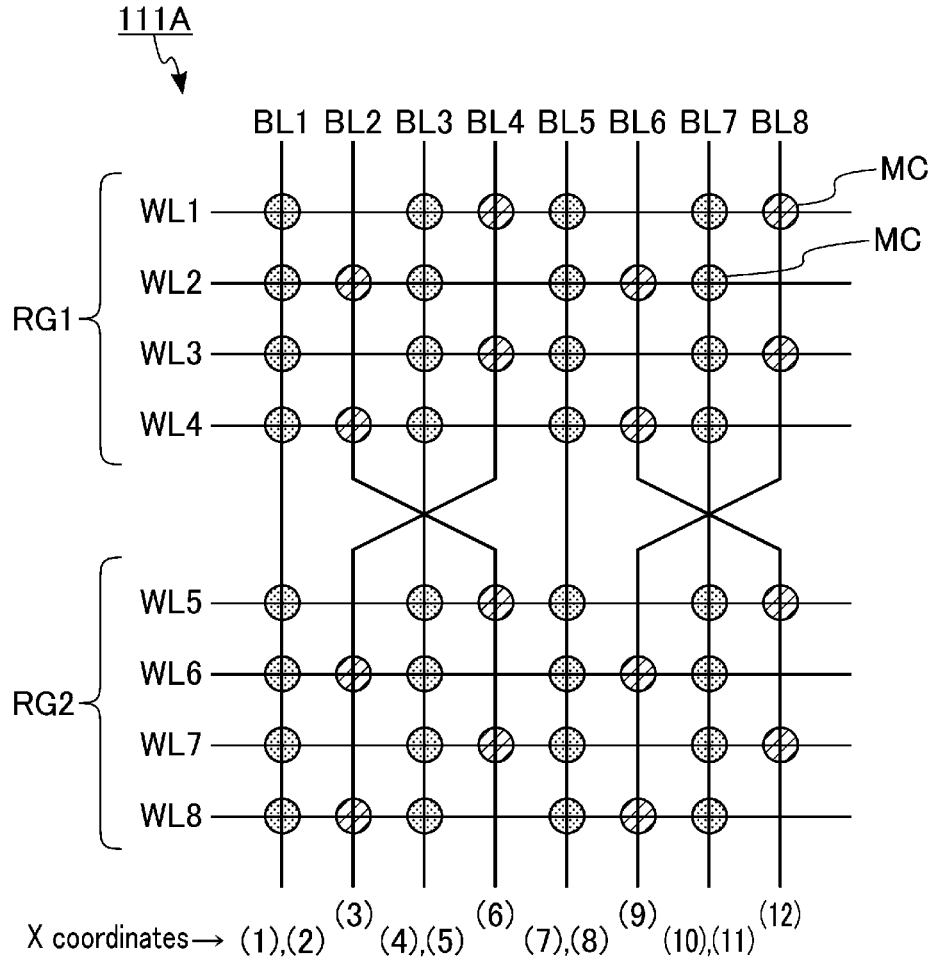
F I G. 12

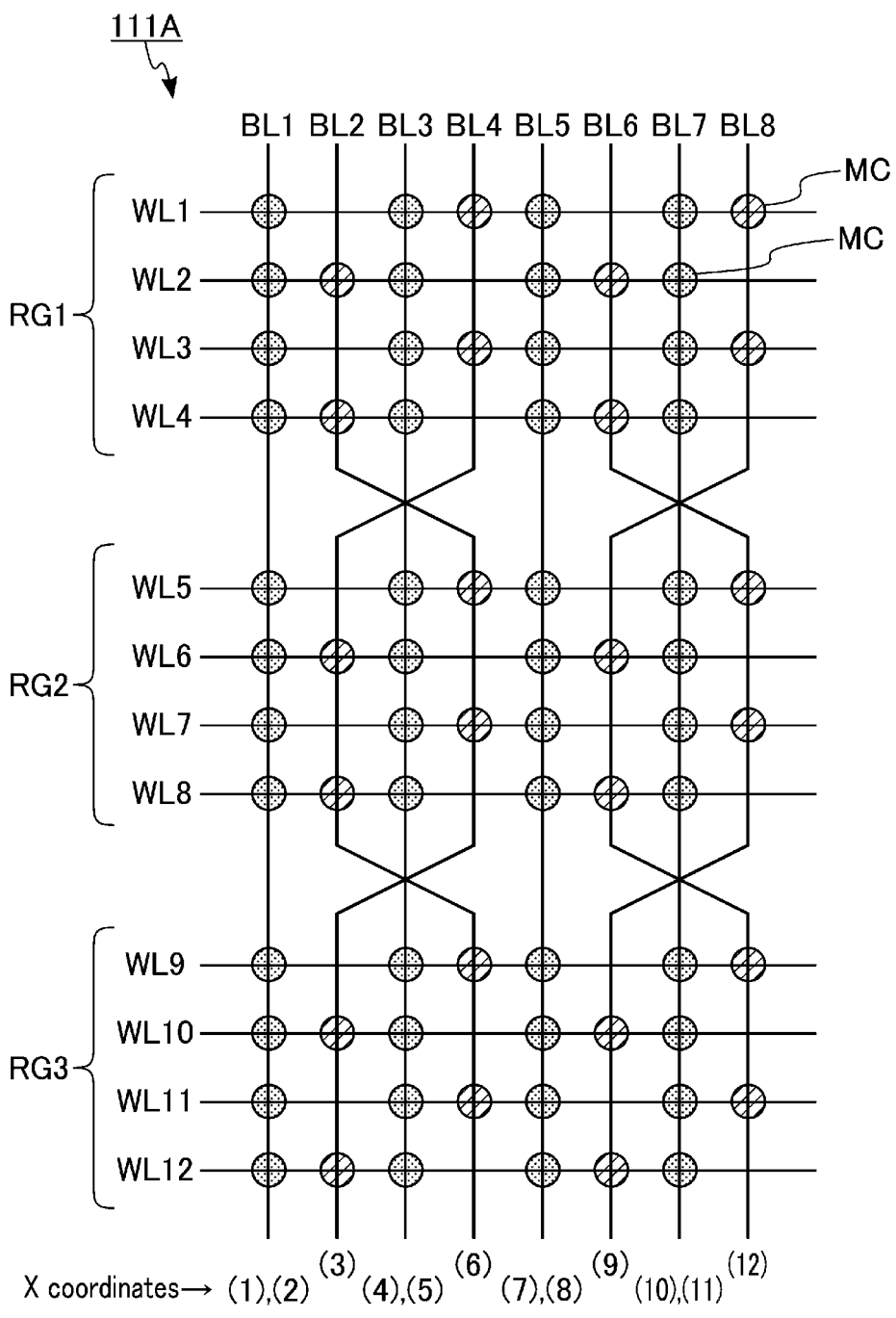
F I G. 13

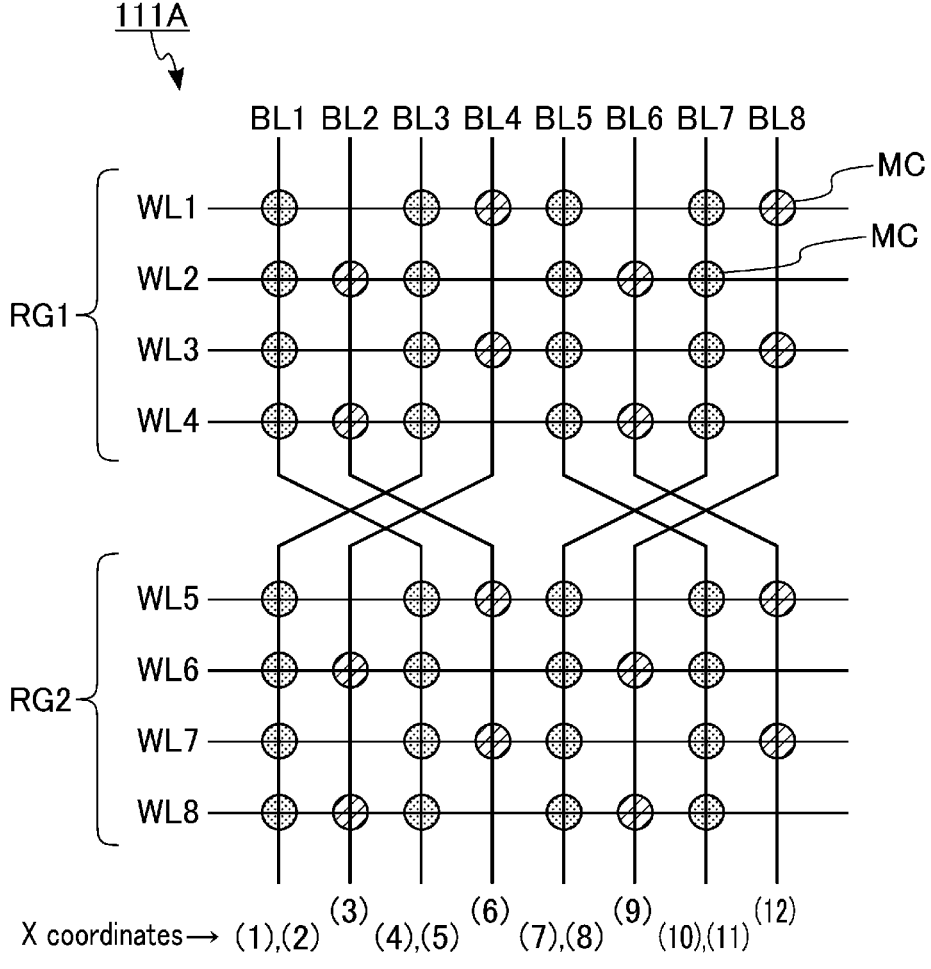
F I G. 14

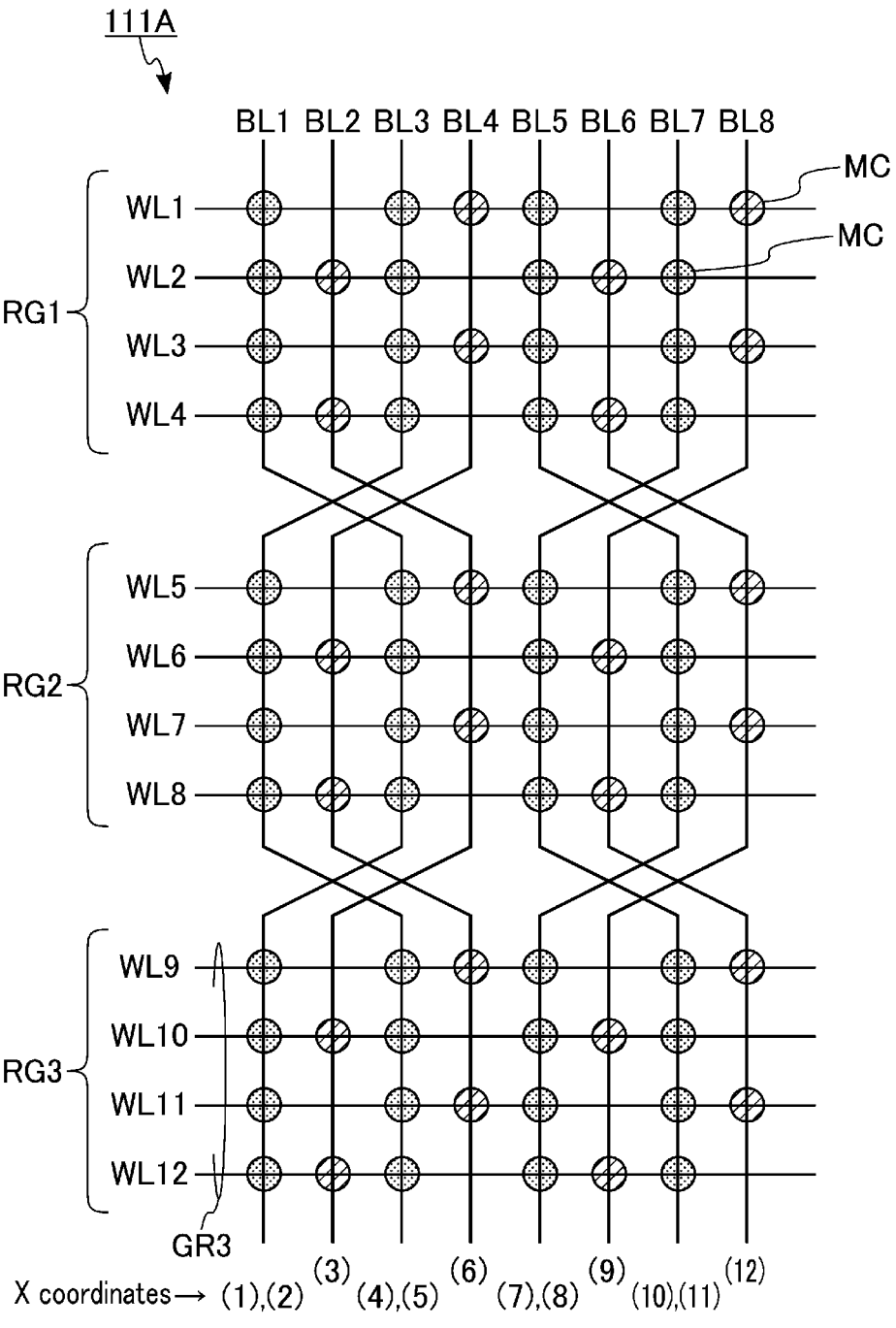
F I G. 15

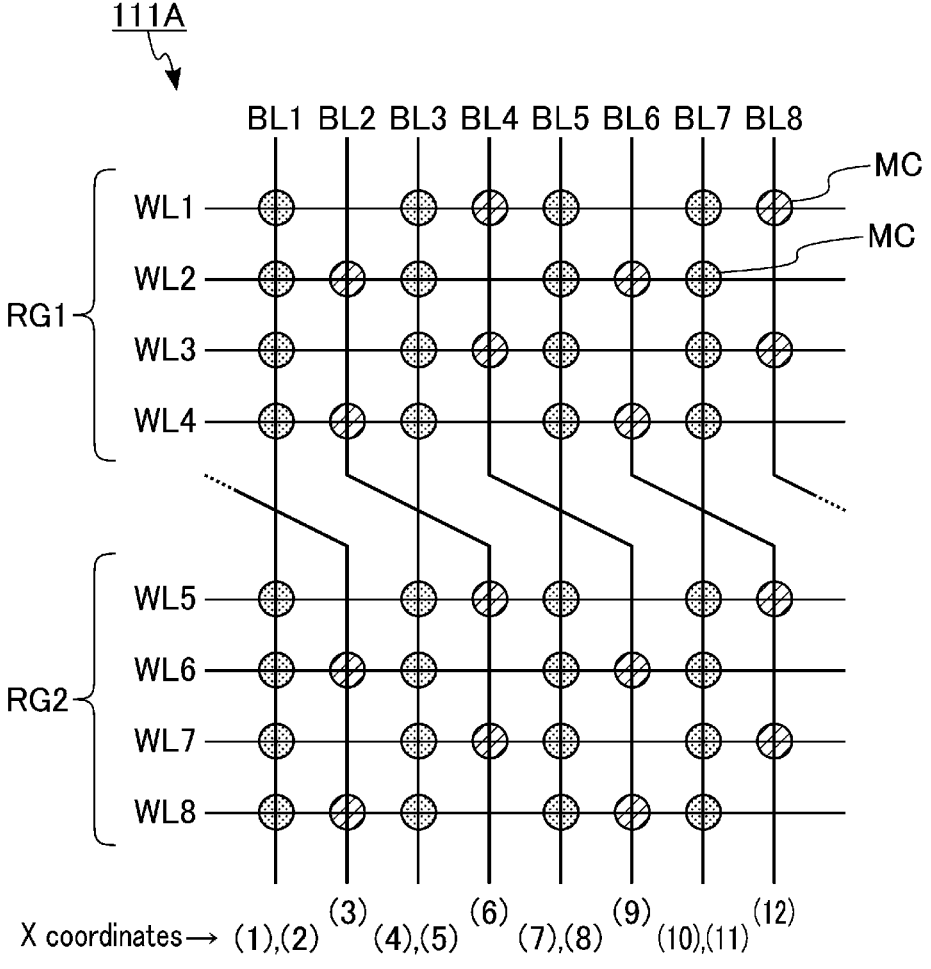
F I G. 16

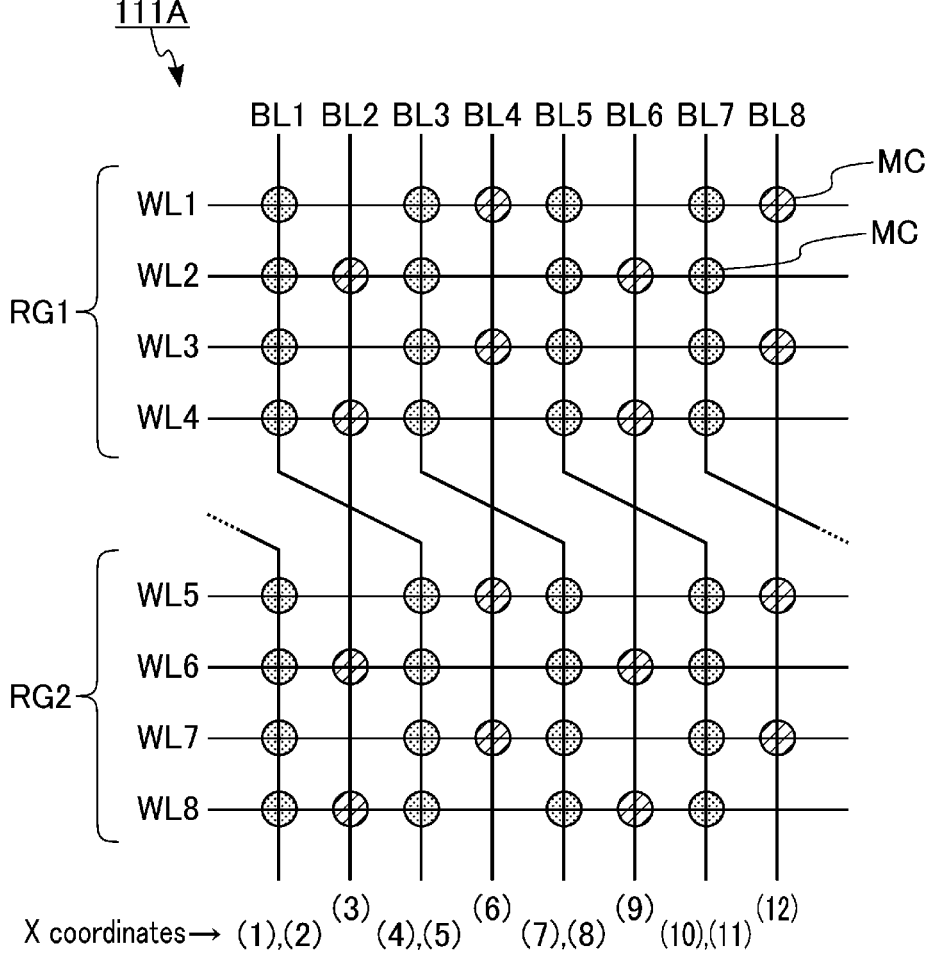
F I G. 17

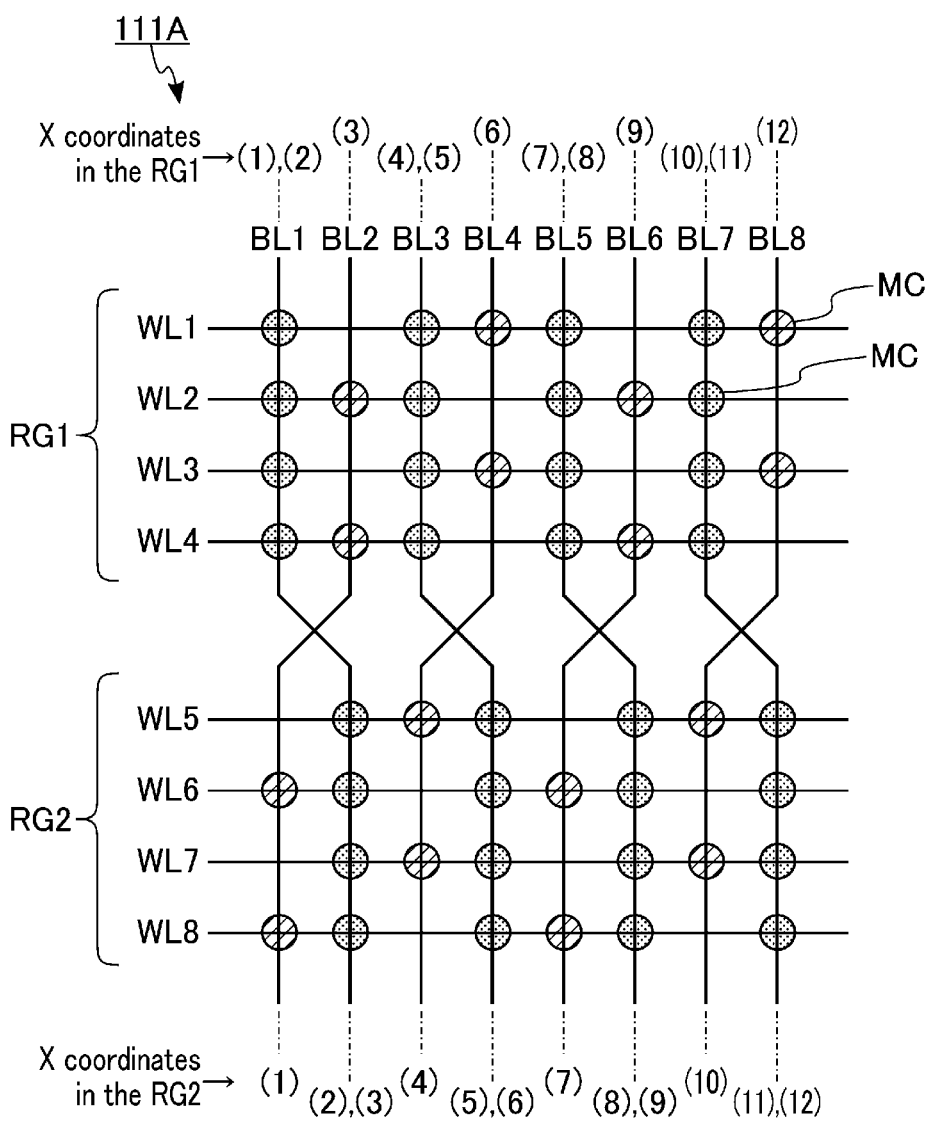
F I G. 18

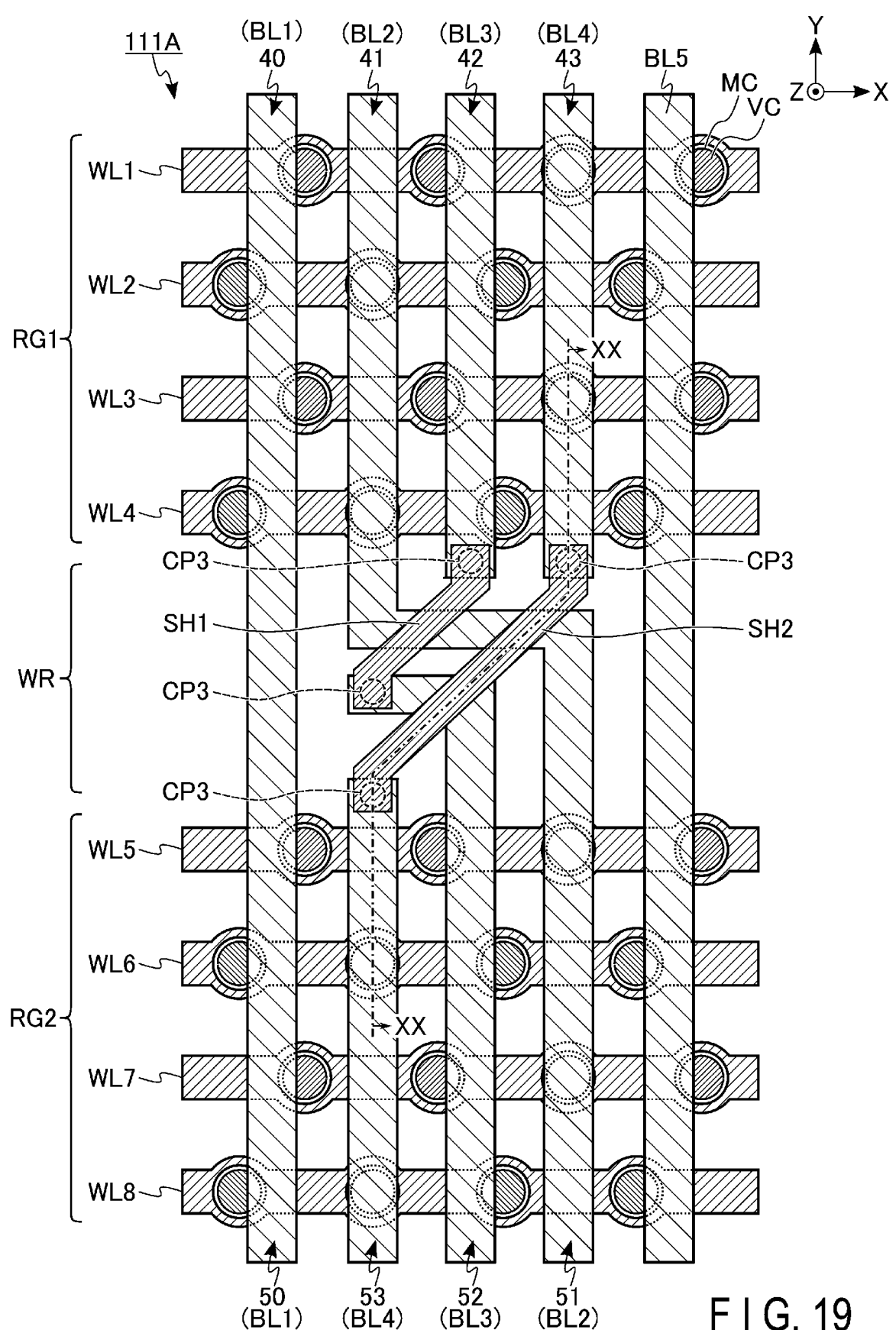
F I G. 19

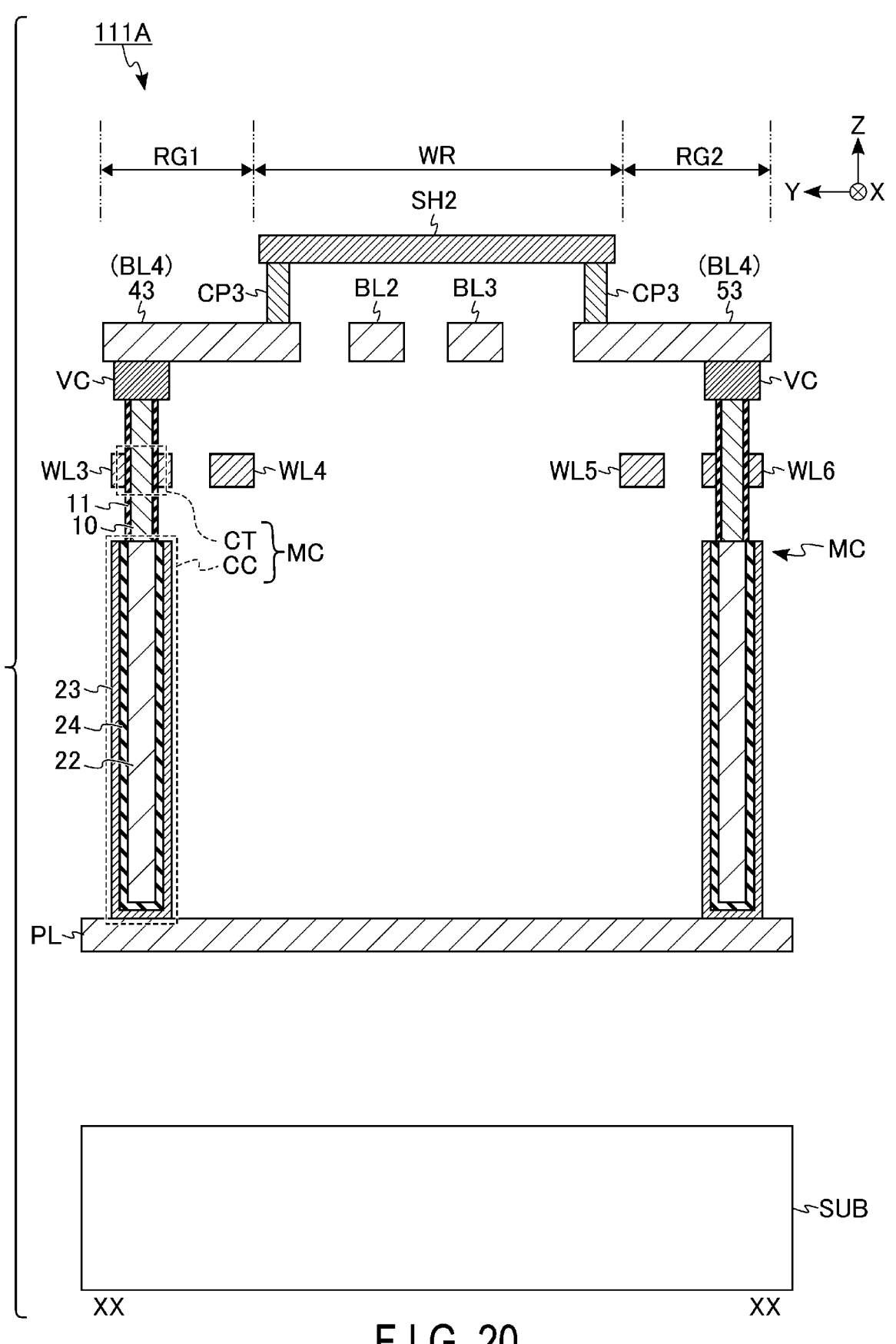
F I G. 20

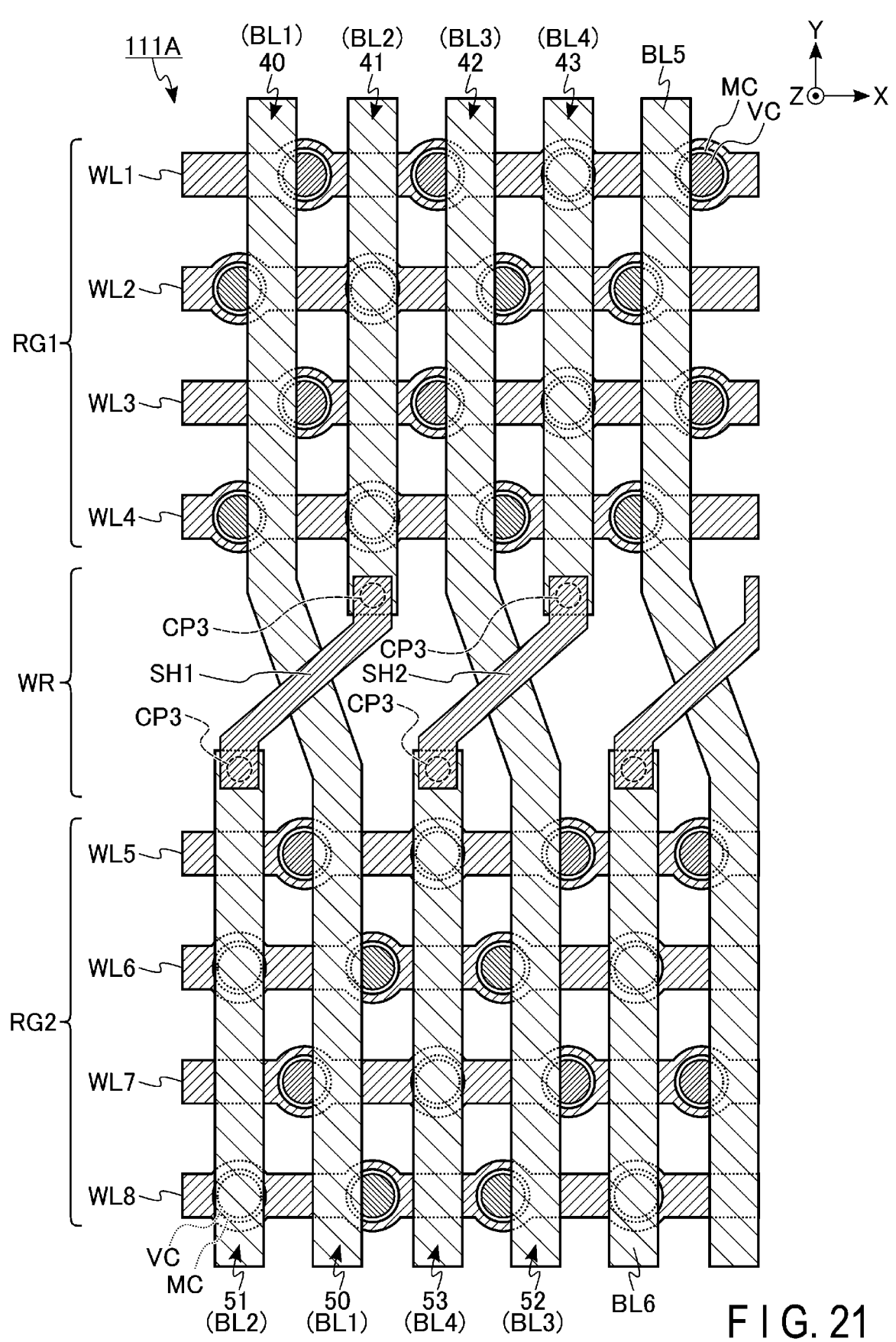
F I G. 21

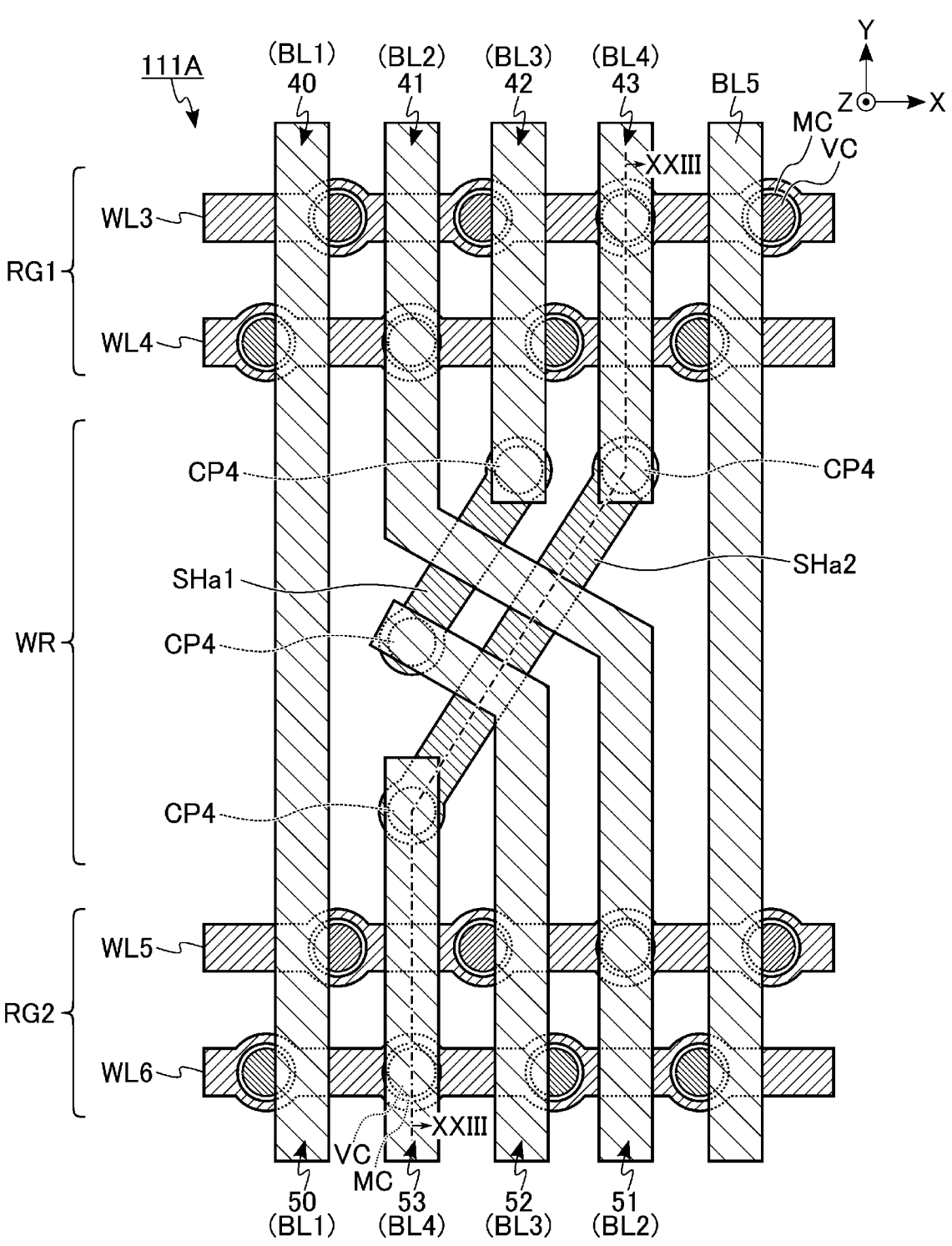
F I G. 22

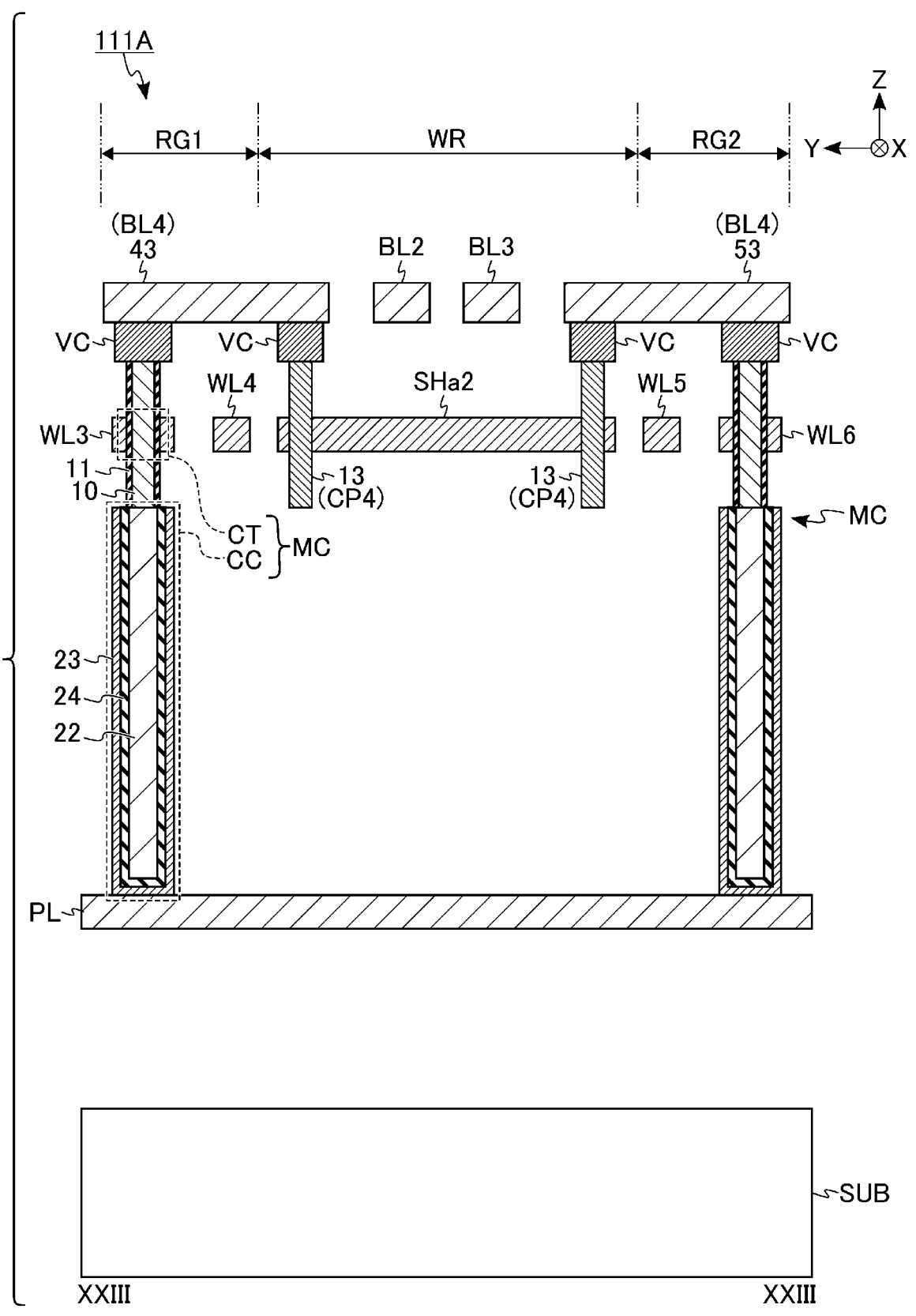
F I G. 23

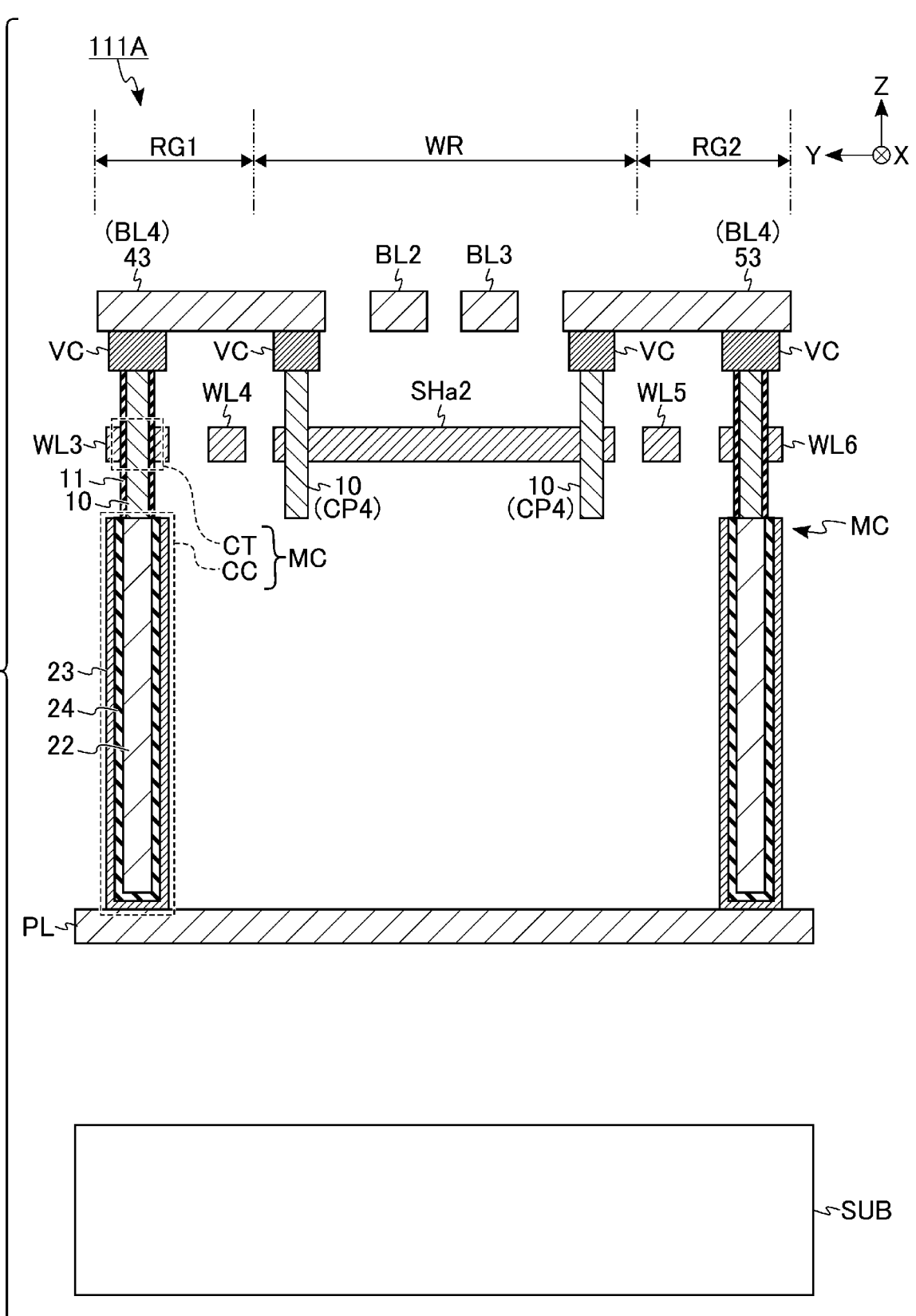
F I G. 24

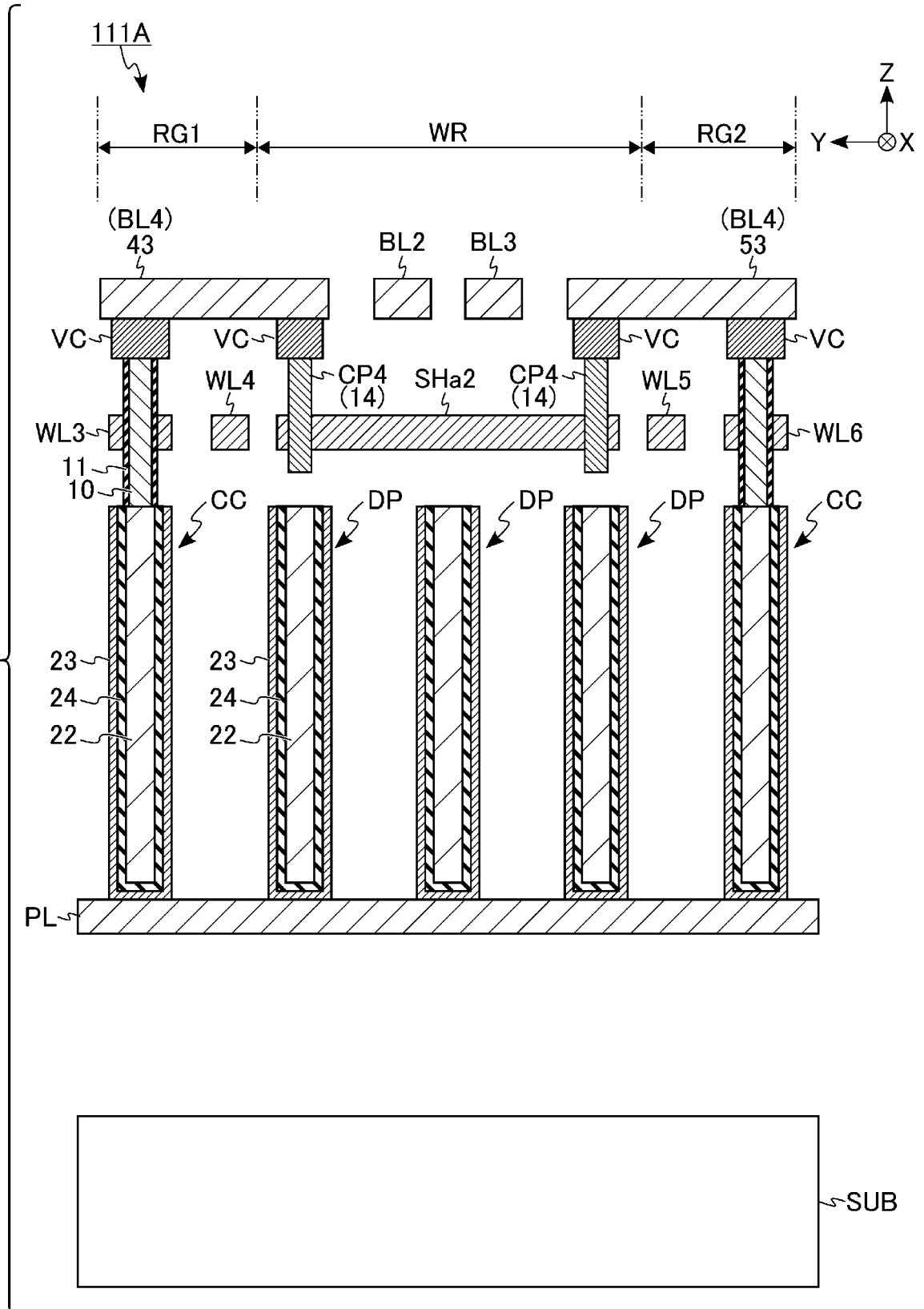
F I G. 25

MEMORY DEVICE

CROSS-REFERENCE TO RELATED APPLICATIONS

This application is based upon and claims the benefit of priority from Japanese Patent Application No. 2022-148181, filed Sep. 16, 2022, the entire contents of which are incorporated herein by reference.

FIELD

Embodiments described herein relate generally to a memory device.

BACKGROUND

As one type of a memory device, a dynamic random access memory (DRAM) has been known. The memory cells of a DRAM include capacitors and transistors. A memory device that adopts vertical transistors for the DRAM cells has also been known. A vertical transistor includes a semiconductor pillar as a channel, which extends in a direction intersecting the main surface of a semiconductor substrate. In the vertical transistor, a gate electrode is formed by an interconnect layer that extends in a direction along the main surface of the substrate and is provided in such a manner as to cover the periphery of the semiconductor pillar.

BRIEF DESCRIPTION OF THE DRAWINGS

FIG. 1 is a block diagram showing an exemplary configuration of a memory device according to the first embodiment.

FIG. 2 is a circuit diagram showing an exemplary circuit configuration of a memory cell array in the memory device according to the first embodiment.

FIG. 3 is a schematic diagram showing an exemplary arrangement of the memory device according to the first embodiment, focusing on the first and second sub-arrays and sense amplifier circuits.

FIG. 4 is a perspective diagram showing an exemplary configuration of a memory cell in the memory device according to the first embodiment.

FIG. 5 is a plan view showing a planar layout of a memory cell array in the memory device according to the first embodiment.

FIG. 6 is a plan view showing an exemplary planar layout of a memory cell array in an open-BL arrangement.

FIG. 7 is a plan view showing an exemplary planar layout of a memory cell array in a folded-BL arrangement.

FIG. 9 is a plan view showing an exemplary planar layout of a memory cell array in a memory device according to the second embodiment.

FIG. 10 is a cross-sectional view showing an exemplary cross-sectional structure of a memory cell array in the memory device according to the second embodiment.

FIG. 11 is a schematic diagram showing the first configuration example of a memory cell array in a memory device according to the third embodiment.

FIG. 12 is a schematic diagram showing the second configuration example of a memory cell array in the memory device according to the third embodiment.

FIG. 13 is a schematic diagram showing the third configuration example of a memory cell array in the memory device according to the third embodiment.

FIG. 14 is a schematic diagram showing the fourth configuration example of a memory cell array in the memory device according to the third embodiment.

FIG. 15 is a schematic diagram showing the fifth configuration example of a memory cell array in the memory device according to the third embodiment.

FIG. 16 is a schematic diagram showing the sixth configuration example of a memory cell array in the memory device according to the third embodiment.

FIG. 17 is a schematic diagram showing the seventh configuration example of a memory cell array in the memory device according to the third embodiment.

FIG. 18 is a schematic diagram showing the eighth configuration example of a memory cell array in the memory device according to the third embodiment.

FIG. 19 is a plan view showing an exemplary planar layout of the second configuration example of the memory cell array in the memory device according to the third embodiment.

FIG. 20 is a cross-sectional view showing an exemplary cross-sectional structure of the second configuration example of the memory cell array, taken along the line XX-XX in FIG. 19, in the memory device according to the third embodiment.

FIG. 21 is a plan view showing an exemplary planar layout of the eighth configuration example of the memory cell array in the memory device according to the third embodiment.

FIG. 22 is a plan view showing an exemplary planar layout of a memory cell array in a memory device according to the fourth embodiment.

FIG. 23 is a cross-sectional view showing the cross-sectional structure of a memory cell array according to the first example, taken along the line XXIII-XXIII in FIG. 22, in the memory device according to the fourth embodiment.

FIG. 24 is a cross-sectional view showing the cross-sectional structure of a memory cell array according to the second example in the memory device according to the fourth embodiment.

FIG. 25 is a cross-sectional view showing the cross-sectional structure of a memory cell array according to the third example in the memory device according to the fourth embodiment.

DETAILED DESCRIPTION

Figure 8:
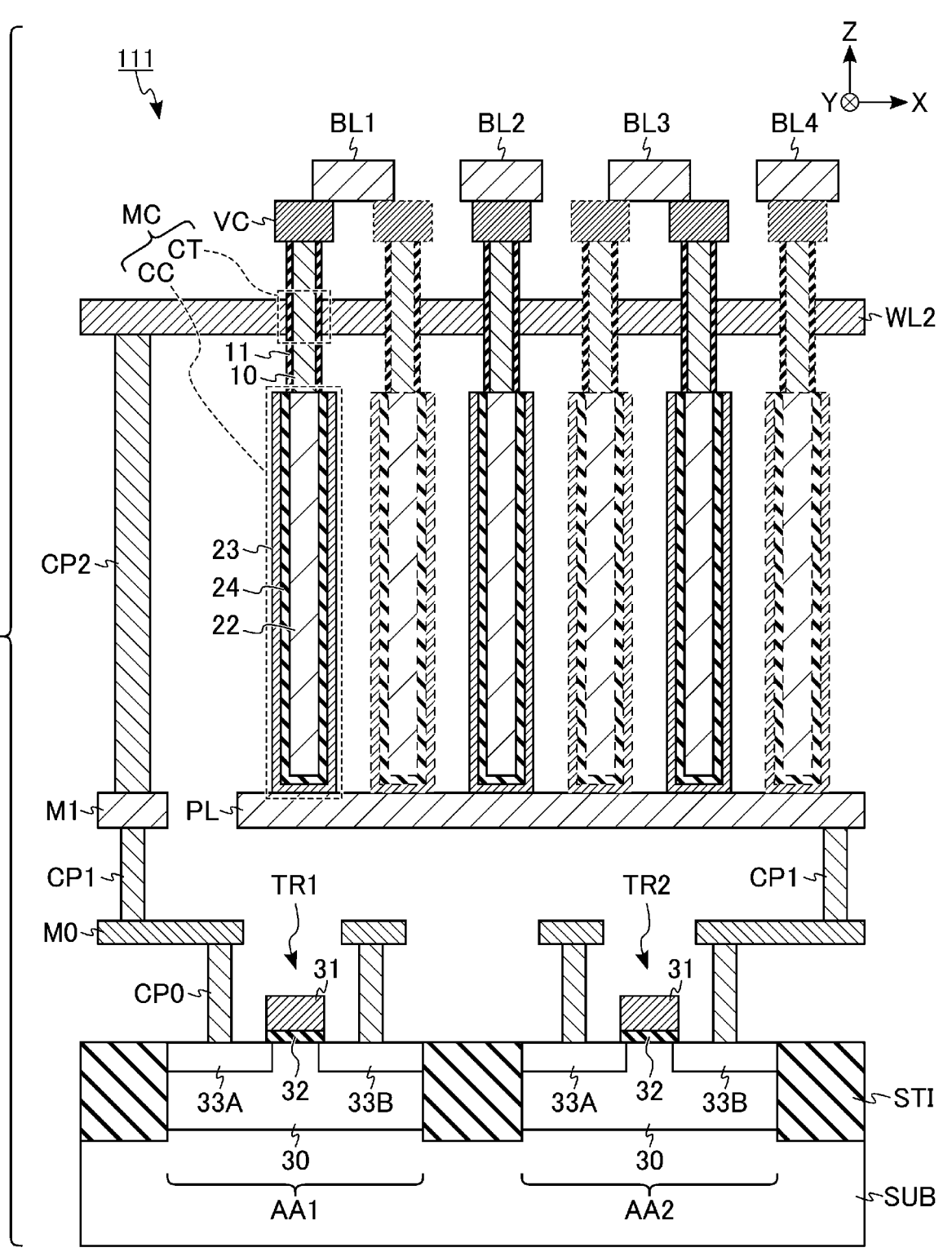
FIG. 8 is a cross-sectional view showing an exemplary cross-sectional structure of a memory cell array in the memory device according to the first embodiment.

In general, according to one embodiment, a memory device includes a plurality of word lines, a plurality of bit lines, a plurality of transistors, a plurality of capacitors, and a plate line. The word lines each extends in a first direction and are arranged in a second direction crossing the first direction. The bit lines each extends in the second direction and are arranged in the first direction. The transistors each includes a channel that extends in a third direction crossing the first direction and the second direction. The capacitors each includes two electrodes one of which is coupled to one end of a corresponding one of the transistors. The plate line is coupled to the other one of the electrodes of each of the capacitors. The transistors include a plurality of first transistors and a plurality of second transistors. The first transistors each has a gate end coupled to a first word line of the word lines. The second transistors each has a gate end coupled to a second word line of the word lines that is adjacent to the first word line. The first transistors and the second transistors are arranged to alternate each other in the first direction. The bit lines include first to fourth bit lines arranged sequentially in the first direction. Each of the first bit line and the third bit line are coupled to the other end of a corresponding one of the first transistors and to the other end of a corresponding one of the second transistors. The second bit line is coupled to the other end of a corresponding one of the first transistors and is not coupled to the other end of any of the second transistors. The fourth bit line is coupled to the other end of a corresponding one of the second transistors and is not coupled to the other end of any of the first transistors.

The embodiments will be explained below by referring to the drawings. The embodiments exemplify a device and method that realize the technical concept of the invention. The drawings are provided merely for schematic or conceptual purposes, and thus may not be identical to the actual dimensions and proportions. Furthermore, the technical concept of the invention is not limited by the form, structure, arrangement or the like of the structural components. In the following description, structural components having basically the same functions and configurations are referred to by the same reference symbols. Numerals or characters may be added after the reference symbols in order to mutually distinguish the components denoted by the same reference symbols and having substantially the same configurations.

<1> First Embodiment

A memory device 100 according to the first embodiment is a dynamic random access memory (DRAM) incorporating both an open-BL arrangement and folded-BL arrangement. The memory device 100 according to the first embodiment will be described in detail below.

<1-1> Overall Configuration of Memory Device 100

FIG. 1 is a block diagram showing an exemplary configuration of the memory device 100 according to the first embodiment. The memory device 100 is electrically connected to an externally provided memory controller 200, as illustrated in FIG. 1. The memory device 100 is configured to read and write data in response to a command from the memory controller 200. The memory device 100 receives, for example, an address ADR, a command CMD, data DT, and a control signal CNT from the memory controller 200. The memory device 100 also transmits the control signal CNT and data DT to the memory controller 200. The memory device 100 includes, for example, a memory cell array 110, a row control circuit 120, a column control circuit 130, a read/write circuit 140, an input/output circuit 150, and a control circuit 160.

The memory cell array 110 is used for data storage. The memory cell array 110 includes multiple sub-arrays 111. These sub-arrays 111 may be divided into two groups. In this example, the sub-arrays 111 include two groups of sub-arrays 111, namely first sub-arrays 111A and second sub-arrays 111B. Each sub-array 111 includes multiple memory cells MC, multiple word lines WL, and multiple bit lines BL. A memory cell MC may store therein data of one bit or more. Each memory cell MC is coupled between a word line WL and a bit line BL. Each word line WL has a row address assigned. Each bit line BL has a column address assigned. Each memory cell MC can be identified by a row address and a column address.

The row control circuit 120 controls interconnects (e.g., word lines WL) assigned in the row direction in the memory cell array 110. The row control circuit 120 selects (activates) a word line WL according to an address ADR. The row control circuit 120 also sets non-selected word lines WL to a non-selected state (i.e., deactivates the word line WL). Thereafter, the row control circuit 120 applies prescribed voltages to the selected word line WL and to the non-selected word lines WL. The row control circuit 120 may include a driver circuit 121 and an address decoder 122. The driver circuit 121 generates a voltage to be applied to the word lines WL. The address decoder 122 decodes the address ADR. The row control circuit 120 selects a word line WL based on the decoding result obtained by the address decoder 122. The row control circuit 120 may also be referred to as a row decoder. The column control circuit 130 controls interconnects (e.g., bit lines BL) assigned in the column direction in the memory cell array 110.

The column control circuit 130 may include an address decoder 131, a column selection circuit 132, and a sense amplifier circuit 133. The address decoder 131 decodes the address ADR. The sense amplifier circuit 133 is provided for each sub-array, and is coupled to the bit lines BL included in the sub-array. In other words, the sense amplifier circuit 133 includes multiple sense amplifiers SA corresponding to the number of sub-arrays and the number of bit lines BL in each sub-array. These sense amplifiers SA include sense amplifiers SAo corresponding to the open-BL arrangement and sense amplifiers SAf corresponding to the folded-BL arrangement. The sense amplifiers SAo and SAf will be described later in detail. The sense amplifier circuit 133 performs operations as described below, in accordance with the operation of the sub-array that is coupled thereto. Upon activation of one of the word lines WL in a specific sub-array by the row control circuit 120, the voltage level of this bit line BL is changed by the data (charge) stored in a memory cell MC connected to the word line WL. The sense amplifier circuit 133 amplifies this change in the voltage level of the bit line BL to a level of the voltage level that can be read by the read circuit. With regard to the memory cell from which the data (charge) disappears due to the reading of the data onto the bit line BL, the sense amplifier circuit 133 re-stores the original data in this memory cell MC with the amplified voltage level. In this manner, the sense amplifier circuit 133 performs operations upon all the bit lines BL in the sub-array having a word line WL activated by the row control circuit 120. The column selection circuit 132 controls data exchanges between the read/write circuit 140 and a bit line BL designated by a column address from among the word lines WL and the bit lines BL activated in the operation of the sense amplifier circuit 133. In the read operation, the column selection circuit 132 outputs to the read circuit the data of a designated one of the bit lines BL amplified by the sense amplifier circuit 133. In the write operation, the column selection circuit 132 changes the voltage level of the designated bit line BL to a level that corresponds to the write data, and stores the new data into the memory cell MC. The column control circuit 130 may also be referred to as a column decoder.

The read/write circuit 140 performs a data write operation to memory cell arrays 110 and a data read operation from memory cell arrays 110. At the time of data writing, the read/write circuit 140 sends a signal (voltage or current) corresponding to the data requested to be written into the memory cell array 110, to the memory cell array 110 by way of the column control circuit 130. At the time of data reading, a signal (a voltage or a current) corresponding to the data read from the memory cell array 110 is received from the memory cell array 110 by way of the column control circuit 130. The memory device 100 may include a circuit for data writing and a circuit for data reading that are independently provided.

The input/output circuit 150 is an interface circuit that controls the communications between the memory device 100 and memory controller 200. The input/output circuit 150 receives a command CMD, an address ADR, data DT (e.g., data requested to be written into the memory cell array 110), control signals CNT, and the like from the memory controller 200. The input/output circuit 150 sends the control signal CNT and data DT (e.g., data read from the memory cell array 110) to the memory controller 200.

The control circuit 160 controls the row control circuit 120, column control circuit 130, read/write circuit 140, and the like, based on the command CMD and control signal CNT, so as to realize the operations that are to be executed by the memory device 100. If the memory device 100 is a DRAM, the control circuit 160 executes a refresh operation upon the data in the memory cell array 110, in addition to the data write operation and the data read operation. In the refresh operation, the data stored in each memory cell MC is read onto the bit line BL by activating the word line WL, and the data read by the sense amplifier circuit 133 is written back to the memory cell MC. The control circuit 160 further controls the row control circuit 120, column control circuit 130, read/write circuit 140, and the like at a timing synchronized with a clock signal CLK. In other words, in the memory device 100, the data write operation and data read operation are executed at a timing synchronized with the clock signal CLK. The clock signal CLK may be generated inside the memory device 100, or may be externally supplied. The control circuit 160 may also be referred to as a sequencer or internal controller.

The memory device 100 is not limited to the above described structure. For instance, the memory device 100 may include a control circuit for controlling a refresh operation, a clock generation circuit, an internal voltage generation circuit, and the like.

<1-2> Circuit Configuration of Memory Device 100

Next, the circuit configuration of the memory device 100 will be described.

<1-2-1> Circuit Configuration of Memory Cell Array 110

FIG. 2 is a circuit diagram showing an exemplary circuit configuration of the memory cell array 110 in the memory device 100 according to the first embodiment. FIG. 2 shows a partial configuration of a sub-array 111 included in the memory cell array 110. The three-dimensional orthogonal coordinate system of FIG. 2 corresponds to the extending direction of the interconnects. As illustrated in FIG. 2, memory cells MC are staggered in a matrix pattern on a plane (X-Y plane) that expands in the X direction and Y direction. The sub-array 111 further includes a plate line PL.

The plate line PL is a plate-like interconnect, which includes a portion that expands along the X-Y plane. A plate voltage level, for example a ground voltage level, is applied to this plate line PL. One end of each memory cell MC is coupled to the plate line PL, and the other end of each memory cell MC is coupled to its associated bit line BL. The plate line PL may also be referred to as a "plate electrode". The plate line PL may be divided into parts in accordance with control units of the control sub-array 111.

Each memory cell MC includes a cell transistor CT and a cell capacitor CC. The cell transistor CT and cell capacitor CC of the memory cell MC are serially coupled between the associated bit line BL and the plate line PL. In particular, in each memory cell MC, one end of the cell transistor CT is coupled to its associated bit line BL, and the other end of the cell transistor CT is coupled to a node ND. Furthermore, in each memory cell MC, one electrode of the cell capacitor CC is coupled to the node ND, and the other end of the cell capacitor CC is coupled to the plate line PL. The cell transistor CT is a field effect transistor, and the cell capacitor CC is a capacitance element. The cell transistor CT may be simply referred to as a "transistor". The cell capacitor CC may be simply referred to as a "capacitor".

The word lines WL included in the sub-array 111 each extend in the X direction and are arranged in the Y direction. Each word line WL is coupled to the gate ends of the cell transistors CT of the memory cells MC that are arranged in the X direction. In other words, each word line WL is coupled to the gate ends of the cell transistors CT of the memory cells MC that have the same row address. The gate end of a cell transistor CT may also be referred to as a "control end of the memory cell MC".

The bit lines BL included in the sub-array 111 each extend in the Y direction and are arranged in the X direction. Each bit line BL is coupled to ends of the cell transistors CT of the memory cells MC arranged in the Y direction. In other words, each bit line BL is coupled to the ends of the cell transistors CT of the memory cells MC that have the same column address.

A cell transistor CT is a switch configured to switch between an electrically connected state and electrically insulated state for the connection between the memory cell MC and bit line BL. The cell transistor CT serves as a select element of the memory cell MC. One end of the cell transistor CT serves as a source end or drain end of the transistor, while the other end of the cell transistor CT serves as a drain end or source end of the transistor. A cell capacitor CC holds an amount of charge corresponding to data of one or more bits. The cell capacitor CC serves as a memory element of the memory cell MC.

<1-2-2> Arrangement of Memory Cell Array 110 and Sense Amplifier Circuit 133

FIG. 3 is a schematic diagram showing an exemplary arrangement of the first sub-array 111A, the second sub-array 111B, and the sense amplifier circuit 133 in the memory device 100 according to the first embodiment. The illustration of FIG. 3 includes eight bit lines BL1 to BL8 and eight word lines WL1 to WL8 included in the first sub-array 111A, eight bit lines BL1 to BL8 and eight word lines WL1 to WL8 included in the second sub-array 111B, as well as memory cells MC, sense amplifiers SAo, and sense amplifiers SAf associated with these lines.

As illustrated in FIG. 3, in the first sub-array 111A, one memory cell MC is coupled between each of the odd-numbered bit lines BL (e.g., BL1, BL3, BL5, and BL7) and each of the word lines WL (e.g., WL1 to WL8); one memory cell MC is coupled between a bit line BL(2+4*k) (where k is an integer larger than or equal to 0) and each of the even-numbered word lines WL (e.g., WL2, WL4, WL6, and WL8); and one memory cell MC is coupled between a bit line BL(4+4*k) and each of the odd-numbered word lines WL (e.g., WL1, WL3, WL5, and WL7).

In the second sub-array 111B, one memory cell MC is coupled between each of the odd-numbered bit lines BL (e.g., BL1, BL3, BL5, and BL7) and each of the word lines WL (e.g., WL1 to WL8); one memory cell MC is coupled between a bit line BL(2+4*k) and each of the even-numbered word lines WL (e.g., WL2, WL4, WL6, and WL8); and one memory cell MC is coupled between a bit line BL(4+4*k) and each of the odd-numbered word lines WL (e.g., WL1, WL3, WL5, and WL7). That is, the circuit configuration of the second sub-array 111B is the same as that of the first sub-array 111A.

The sense amplifier circuit 133 may include multiple sense amplifiers SAo between the first sub-array 111A and second sub-array 111B, multiple sense amplifiers SAf corresponding to the first sub-array 111A, and multiple sense amplifiers SAf corresponding to the second sub-array 111B. In the drawings of this specification, different hatch patterns are adopted to mutually distinguish open-BL memory cells MC and folded-BL memory cells MC.

The sense amplifiers SAo are coupled to the odd-numbered bit lines BL of the first sub-array 111A and the odd-numbered bit lines BL of the second sub-array 111B. In particular, a sense amplifier SAo is coupled to the bit line BL1 of the first sub-array 111A and the bit line BL1 of the second sub-array 111B; another sense amplifier SAo is coupled to the bit line BL3 of the first sub-array 111A and the bit line BL3 of the second sub-array 111B; . . . ; and a sense amplifier SAo is coupled to the bit line BL7 of the first sub-array 111A and the bit line BL7 of the second sub-array 111B. Each sense amplifier SAo uses either one of the bit line BL of the first sub-array 111A or the bit line BL of the second sub-array 111B as a reference bit line BL to amplify the voltage or current that is based on the data read from a selected memory cell MC that is coupled to the other one of the bit lines BL (open-BL arrangement).

A sense amplifier SAf corresponding to the first sub-array 111A is coupled to the bit lines BL(2+4*k) and BL(4+4*k) of the first sub-array 111A. In particular, a sense amplifier SAf is coupled to the bit lines BL2 and BL4 of the first sub-array 111A, and another sense amplifier SAf is coupled to the bit lines BL6 and BL8 of the first sub-array 111A. Similarly, a sense amplifier SAf corresponding to the second sub-array 111B is coupled to the bit lines BL(2+4*k) and BL(4+4*k) of the second sub-array 111B. Each of the sense amplifiers SAf uses either one of the two bit lines BL corresponding to the sub-array 111 as a reference bit line BL to amplify the voltage or current that is based on the data read from a selected memory cell MC that is coupled to the other bit line BL (folded-BL arrangement). According to FIG. 3, sense amplifiers SAf are provided for the first sub-array 111A and for the second sub-array 111B, which is not a limitation. The sense amplifiers SAf may be shared by the first sub-array 111A and second sub-array 111B, or in other words by two adjacent sub-arrays 111 in the extending direction of the bit lines BL (e.g., Y direction) by way of a switch or the like.

As described above, in the memory cell array 110 of the memory device 100 according to the first embodiment, the bit lines BL of the open-BL arrangement and the bit lines BL of the folded-BL arrangement are alternately arranged. Furthermore, among the bit lines BL of the folded-BL arrangement, bit lines BL that are coupled to the memory cells MC controlled by the odd-numbered word lines WL and bit lines BL that are coupled to the memory cells MC controlled by the even-numbered word lines WL are alternately arranged. This means that the memory device 100 realizes the operation of the folded-BL arrangement by adopting any two adjacent bit lines BL between which a bit line BL used for the open-BL arrangement is interposed. Furthermore, each of the sense amplifiers SAo used for the open-BL arrangement is coupled to one bit line BL of the first sub-array 111A and one bit line BL of the second sub-array 111B. Each of the sense amplifiers SAf used for the folded-BL arrangement is coupled to any two bit lines BL that are included in the associated sub-array 111, arranged with a bit line BL of the open-BL arrangement interposed in-between, and used in the folded-BL arrangement.

A repeating unit incorporating the open-BL arrangement and folded-BL arrangement may be represented by a group of four bit lines BL arranged in the X direction. For instance, the bit lines BL according to the first embodiment provided in the sub-array 111 include groups of four bit lines BL1 to BL4 arranged in the X direction, and these groups are repeated in the X direction. For instance, the configuration of a memory cell MC corresponding to the bit lines BL1 to BL4 is the same as a memory cell MC corresponding to the bit line BL5 to BL8.

<1-3> Configuration of Memory Device 100

An exemplary configuration of the memory device 100 according to the first embodiment will be described below. In this description, the Z direction is a direction vertical to the X-Y plane, which corresponds, for example, to a direction perpendicular to the surface of the semiconductor substrate SUB that is used for formation of the memory device 100. The semiconductor substrate SUB may be a silicon substrate. Terms such as "under", "below" and "lower" relate to a position having a smaller Z coordinate on the Z axis. Terms such as "above" and "upper" relate to a position having a larger Z coordinate on the Z axis. Hatch patterns are suitably attached to plan views. These hatch patterns, however, may not relate to the materials or properties of the hatch-patterned structural components. The components may be suitably omitted from the illustration of the configuration in the drawings.

<1-3-1> Configuration of Memory Cell MC

FIG. 4 is a perspective diagram showing an exemplary configuration of a memory cell MC in the memory device 100 according to the first embodiment. FIG. 4 focuses on a single memory cell MC in the memory cell array 110 to describe the configuration of the memory cells MC. The plate line PL is provided above the semiconductor substrate SUB, as illustrated in FIG. 4. A memory cell MC is provided on the plate line PL, and a contact VC is provided on the memory cell MC. A bit line BL is provided on the contact VC.

A cell transistor CT is a vertical transistor that includes a channel region extending along the Z direction. The cell transistor CT includes a semiconductor layer 10, a gate insulating layer 11, and a gate electrode 12. The semiconductor layer 10 is provided so as to extend in the Z direction. In other words, the semiconductor layer 10 has a columnar structure that extends in the Z direction. The gate electrode 12 faces the circumferential surface of the semiconductor layer 10, with a gate insulating layer 11 interposed. The gate insulating layer 11 is provided between the circumferential surface of the semiconductor layer 10 and the gate electrode 12. The channel region of the cell transistor CT is provided in the semiconductor layer 10. The semiconductor layer 10 may also be referred to as a semiconductor pillar or a channel pillar. The source region and drain region of the cell transistor CT are provided inside the semiconductor layer 10. Either one of the source region or drain region is provided in the upper portion of the semiconductor layer 10, while the other one of the drain region or source region is provided in the lower portion of the semiconductor layer 10. The source region or drain region in the upper portion of the cell transistor CT may be coupled to a bit line BL by way of a contact VC. The drain region or source region in the lower portion of the cell transistor CT is coupled to a cell capacitor CC.

For the semiconductor layer 10 (channel material) of the cell transistor CT, an oxide semiconductor may be adopted. When the semiconductor layer 10 is an oxide semiconductor, the semiconductor layer 10 may include, for example, indium oxide, gallium oxide, and zinc oxide. Oxide semiconductors, which include indium oxide, gallium oxide, and zinc oxide, may be referred to as In—Ga—Zn oxide (IGZO). For the oxide semiconductor, an oxide containing at least one of indium, zinc, and tin (e.g., InO, InZnO, InSnO, SnO, ZnO, and ZnSnO) may also be adopted.

A cell transistor CT has a gate structure that is referred to as a gate-all-around (GAA) structure. In the cell transistor CT having a GAA structure, the gate electrode 12 entirely covers the circumferential surface of the channel region of the semiconductor layer 10. The gate electrode 12 circularly covers the circumferential surface of the channel region (along the Z direction) with the gate insulating layer 11 interposed. As a result, the cell transistor CT exhibits an excellent control force on the potential of the gate. The gate electrode 12 is coupled to a conductive layer 19 extending in the X direction. In this example, a pair of a gate electrode 12 and a conductive layer 19 corresponds to a word line WL. The gate electrode 12 and conductive layer 19 may form a boundary in between, or may be provided in continuity.

A cell capacitor CC includes two conductive layers 22 and 23 and an insulating layer 24. The insulating layer 24 is provided between two conductive layers 22 and 23. That is, the conductive layer 22 extends in the Z direction. A semiconductor layer 10 is coupled to the upper portion of the conductive layer 22. That is, the upper portion of the conductive layer 22 is coupled to the source region or drain region of the cell transistor CT. The side surface and lower portion of the conductive layer 22 is covered by the insulating layer 24. The side surface and lower portion of the insulating layer 24 is covered by the conductive layer 23. The bottom portion of the conductive layer 23 is coupled to the plate line PL. That is, the insulating layer 24 and conductive layer 23 are provided between the bottom portion of the conductive layer 22 and the plate line PL. The conductive layer 22 is therefore separated from the plate line PL. These two conductive layers 22 and 23 may also be referred to as capacitor electrodes, or simply as electrodes. The insulating layer 24 may also be referred to as a capacitor insulating layer. The insulating layer 24 may be configured so as to be in contact with the plate line PL, without a conductive layer 23 provided in the lower portion of the insulating layer 24.

As described above, the memory device 100 according to the first embodiment has a memory cell array 110 having a three-dimensional structure. Each memory cell MC includes a vertical transistor as a cell transistor CT, and the current path of the vertical transistor runs along the Z direction. The cell transistor CT therefore passes the current in the Z direction. According to the first embodiment, a memory cell MC includes a layer stack of a cell transistor CT and a cell capacitor CC. In this manner, the structure of the memory device 100 improves the integration of the memory cells MC and thereby improves the storage density of the memory cell array 110. For instance, the memory device 100 can be realized with memory cells MC having a size of approximately $4F^2$.

<1-3-2> Planar Layout of Memory Cell Array 110

FIG. 5 is a plan view showing a planar layout of the memory cell array 110 in the memory device 100 according to the first embodiment. The drawing shows five bit lines BL1 to BL5 and four word lines WL1 to WL4 of the sub-array 111, memory cells MC and contacts VC associated with these lines. As illustrated in FIG. 5, memory cells MC are arranged in a staggered pattern. Each memory cell MC and its associated bit line BL are mutually coupled via a contact VC.

In the following description, the coordinates in the X direction (X coordinates) will be assigned to different sets of memory cells MC arranged in the Y direction. In particular, X coordinates (1) to (M) (where M is an integer greater than or equal to 4) are assigned to the memory cells MC in a sub-array 111. In the sub-array 111, in the arrangement of the memory cells MC arranged in the Y direction, sets of memory cells MC having odd-numbered coordinates and sets of memory cells MC having even-numbered coordinates are alternately arranged. For instance, the memory cells MC having odd-numbered coordinates are coupled to an even-numbered word line WL (e.g., WL2 or WL4). The memory cells MC having even-numbered coordinates are coupled to an odd-numbered word line WL (e.g., WL1 or WL3). In the following, the memory cells MC having odd-numbered coordinates will be referred to as "odd-numbered memory cells MC", and the memory cells MC having even-numbered coordinates will be referred to as "even-numbered memory cells MC".

According to the first embodiment, odd-numbered memory cells MC and even-numbered memory cells MC are coupled to the bit line BL1, while only odd-numbered memory cells MC are coupled to the bit line BL2. Odd-numbered memory cells MC and even-numbered memory cells MC are coupled to the bit line BL3, while only even-numbered memory cells MC are coupled to the bit line BL4. In other words, the memory cells MC having coordinates (1) and (2) are respectively coupled to the bit line BL1, while the memory cells MC having coordinate (3) are respectively coupled to the bit line BL2. The memory cells MC having coordinates (4) and (5) are coupled to the bit line BL3, while the memory cells MC having coordinate (6) are respectively coupled to the bit line BL4. For coordinates (7) and on, the planar layout of coordinates (1) to (6) is repeated. Among the odd-numbered bit lines BL (BL1, BL3, . . . ), the bit lines BL coupled to both the odd-numbered memory cells MC and even-numbered memory cells MC are arranged in the X direction. Among the even-numbered bit lines BL (BL2, BL4, . . . ), the bit lines BL (e.g., BL2) coupled to the odd-numbered memory cells MC and the bit lines BL (e.g., BL4) coupled to the even-numbered memory cells MC are alternately arranged in the X direction. According to the first embodiment, the width of an odd-numbered bit line BL may be the same as, or different from, the width of an even-numbered bit line BL.

In the memory device 100 according to the first embodiment, as illustrated in FIG. 5, the arrangement of the bit lines BL and memory cells MC at coordinates (1) to (6) forms one unit for repetition, adopting the open-BL arrangement and folded-BL arrangement. In the first embodiment, four bit lines BL1 to BL4 are provided in correspondence with coordinates (1) to (6). By referring to FIGS. 6 and 7, the memory cell array 111X constituted with the open-BL arrangement only and the memory cell array 111Y constituted with the folded-BL arrangement only will be compared with the memory cell array 111 according to the first embodiment, and differences in the pitch of bit lines BL will be discussed. FIG. 6 is a plan view showing an exemplary planar layout of an open-BL memory cell array, and FIG. 7 is a plan view showing an exemplary planar layout of a folded-BL memory cell array. The memory cells MC in FIGS. 6 and 7 have the same arrangement density as that of the memory cells MC according to the first embodiment illustrated in FIG. 5, and the only difference resides in the arrangement of bit lines BL.

As illustrated in FIG. 6, in the memory cell array 111X constituted with the open-BL arrangement only, the arrangement of a bit line BL and memory cells MC at coordinates (1) and (2) forms one unit for repetition. In the open-BL arrangement, one bit line BL1 is provided in association with the coordinates (1) and (2). This means that three bit lines BL1 to BL3 are provided for coordinates (1) to (6). In the memory cell array 111X, if the memory cells MC have the same arrangement density as that of the first embodiment, the number of bit lines BL arranged in the array becomes 3/4 of the number of bit lines BL in the first embodiment. In other words, with the memory cells MC having the same density, the pitch of bit lines BL in the memory cell array 111X with the open-BL arrangement only becomes 4/3 of the pitch in the first embodiment.

On the other hand, as illustrated in FIG. 7, in the memory cell array 111Y constituted by the folded-BL arrangement only, the arrangement of bit lines BL and memory cells MC at the coordinates (1) and (2) forms one unit for repetition. In the folded-BL arrangement, two bit lines BL1 and BL2 are provided in association with the coordinates (1) and (2). This means that six bit lines BL1 to BL6 are provided for coordinates (1) to (6). In the memory cell array 111Y, if the memory cells MC have the same arrangement density as that of the first embodiment, the number of bit lines BL arranged in the array becomes 6/4=3/2 of the number of bit lines BL in the first embodiment. In other words, with the memory cells MC having the same density, the pitch of bit lines BL in the memory cell array 111Y with the folded-BL arrangement only becomes 2/3 of the pitch in the first embodiment.

<1-3-3> Cross-Sectional Structure of Memory Cell Array 110

FIG. 8 is a cross-sectional view showing an exemplary cross-sectional structure of the memory cell array 110 in the memory device 100 according to the first embodiment. FIG. 8 shows four bit lines BL1 to BL4 and a word line WL2 included in the sub-array 111, memory cells MC associated with these lines, and part of the CMOS circuit for controlling the word line WL2 and the plate line PL. The memory cells MC and contacts VC arranged rearward with respect to the depth direction of the drawing are indicated with broken lines. As illustrated in FIG. 8, the memory device 100 includes transistors TR1 and TR2, multiple contacts CP0, CP1, and CP2, and multiple interconnects M0 and M1.

The transistors TR1 and TR2 are field effect transistors provided on the semiconductor substrate SUB. The transistors TR1 and TR2 are included in the CMOS circuit such as the row control circuit 120 and column control circuit 130.

The transistors TR1 and TR2 are provided in association with the active regions AA1 and AA2 formed in the semiconductor substrate SUB, respectively. Each of the active regions AA1 and AA2 is surrounded by shallow trench isolation (STI). Each of the active regions AA1 and AA2 includes a well region 30 provided in the semiconductor substrate SUB.

Each transistor TR includes a gate electrode 31, a gate insulating layer 32, and two source/drain regions 33A and 33B. The gate electrode 31 is provided above the well region 30 with respect to the Z direction. The gate insulating layer 32 is provided between the top surface of the well region 30 and the gate electrode 31. The two source/drain regions 33A and 33B are provided in the well region 30. One of the source/drain regions 33A and 33B serves as a source of the transistor TR, and the other one serves as a drain of the transistor TR. The portion between the source/drain regions 33A and 33B in the well region 30 serves as a channel region of the transistor TR. The channel region is arranged underneath the gate electrode 31 with the gate insulating layer 32 interposed. Each transistor TR is covered with an interlayer insulating layer (not shown) deposited on the semiconductor substrate SUB.

A contact CP0 is a pillar conductor provided on the semiconductor substrate SUB and coupled to the transistor TR or the like. An interconnect M0 is a conductor arranged on the corresponding contact CP0 and formed of a metal, for example. A contact CP1 is a pillar conductor provided on the corresponding interconnect M0. An interconnect M1 is a conductor provided on the corresponding contact CP1 and formed of a metal, for example. The plate line PL may be provided on the contact CP1, at the same height as the interconnect M1. The plate line PL, however, does not need to be at the same height as the interconnect M1, and may be provided at a different height. The plate line PL is a plate-like conductor and is formed of a metal, for example. The plate line PL may also be referred to as a plate electrode or plate layer. A contact CP2 is a pillar conductor provided on the corresponding interconnect M1. A contact CP2 connects the interconnect M1 to the corresponding word line WL. In this example, the transistor TR1 is coupled to the word line WL2 by way of the contact CP0, interconnect M0, contact CP1, interconnect M1, and contact CP2. The transistor TR2 is coupled to the plate line PL by way of the contact CP0, interconnect M0, and contact CP1.

The word lines WL are provided above the plate line PL. The cell capacitor CC of each memory cell MC is provided on the plate line PL. The cell transistor CT (vertical transistor) is provided on the cell capacitor CC, penetrating the corresponding word line WL. A contact VC is provided on a cell transistor CT so as to couple this cell transistor CT to a bit line BL. The contacts VC are spaced apart from the word lines WL. That is, each word line WL is provided in a layer between the plate line PL and the contacts VC.

The even-numbered bit lines BL are deposited in such a manner as to overlap the respectively corresponding contacts VC. The odd-numbered bit lines BL are deposited in such a manner as to partially overlap the contacts VC on the odd-numbered memory cells MC and partially overlap the contacts VC on the even-numbered memory cells MC. In this manner, the odd-numbered bit lines BL can be coupled to two memory cells MC at two adjacent coordinates. The contact VC may also be referred to as a landing pad. The width of an odd-numbered bit line BL may be the same as, or different from, that of an even-numbered bit line BL.

In the structure of FIG. 8, the transistors TR1 and TR2 are arranged beneath the plate line PL, but the structure is not limited thereto. The transistors TR1 and TR2, when planarly viewed, may be arranged in such a manner as to overlap the plate line PL, or to not overlap the plate line PL.

<1-4> Effects of First Embodiment

The memory device 100 according to the first embodiment described above can improve its performance, while reducing the production costs. The effects of the first embodiment will be discussed in detail below.

In a one-transistor one-capacitor (1T1C) DRAM (having a $4F^2$ cell structure), for example, which adopts an oxide semiconductor for a vertical access transistor, the parasitic capacitance tends to increase in accordance with an increased density of memory cells. Thus, there is a growing demand for an improved data read margin (sense margin).

In an open-BL arrangement, two adjacent sub-arrays 111 are paired so that one of the sub-arrays can be used as a read-target bit line BL and the other can be used as a reference bit line BL. The bit lines BL in the open-BL arrangement are coupled to the memory cells MC that are coupled to the odd-numbered word lines WL and also to the memory cells MC that are coupled to the even-numbered word lines WL, via landing pads (contacts VC), for example. In the open-BL arrangement, however, due to the reference bit lines BL that belong to a sub-array different from the one for the target bit lines BL, a difference in the coupling noise that is caused by a parasitic capacitance between the word lines WL and bit lines BL tends to appear between the read target bit line BL and the reference bit line BL. This tends to lower the data read margin.

In a folded-BL arrangement, a read-target bit line BL and a reference bit line BL are provided in the same sub-array 111. Thus, similar noise components caused in the read-target bit line BL and reference bit line BL cancel each other, which enhances the read margin in comparison with the open-BL arrangement. In the folded-BL arrangement, however, the coupled bit lines BL need to be differentiated between the memory cells MC coupled to the odd-numbered word lines WL and the memory cells MC coupled to the even-numbered word lines WL, which means that the number of bit lines BL needs to be doubled with respect to the open-BL arrangement. In the folded-BL arrangement, the pitch of bit lines BL therefore needs to be reduced by half with respect to the open-BL arrangement, which raises difficulties in the production. Furthermore, with the pitch reduced by half, the bit lines BL need to be thinned, which tends to raise the resistance of the bit lines BL.

In light of the above circumstances, the memory device 100 according to the first embodiment incorporates both an open-BL arrangement and folded-BL arrangement. That is, in the structure of the memory device 100 according to the first embodiment, bit lines BL coupled to a group of memory cells MC that are activated by the adjacent even-numbered word line WL and odd-numbered word line WL, and bit lines BL coupled either to memory cells activated by an even-numbered word line WL or to memory cells activated by an odd-numbered word line WL are alternately arranged. In this manner, in the memory device 100 according to the first embodiment, a memory cell array 110 (sub-array 111) can be realized in which bit lines BL of the open-BL arrangement and bit lines BL of the folded-BL arrangement are alternately deposited. Such a configuration can reduce the noise at the time of restoring, with half of the bit lines BL of the open-BL arrangement being shielded by the bit lines BL of the folded-BL arrangement.

As a result, in comparison with the structure having an open-BL arrangement only, the memory device 100 according to the first embodiment can improve the read margin. In addition, in comparison with the structure having a folded-BL arrangement only, the memory device 100 according to the first embodiment widens the pitch of bit lines BL, making the production less difficult. Less difficult production means a shorter period required for improving the production process and an improved yield offered, which can lower the production costs. Thus, the memory device 100 according to the first embodiment can improve the performance of the memory device 100, while reducing production costs.

<2> Second Embodiment

In a memory device 100 according to the second embodiment, the bit lines BL of the open-BL arrangement and the bit lines BL of the folded-BL arrangement are provided at different heights of the structure. The memory device 100 according to the second embodiment will be described in detail below.

<2-1> Configuration of Memory Device 100

<2-1-1> Planar Layout of Memory Cell Array 110

FIG. 9 is a plan view showing a planar layout of the memory cell array 110 in the memory device 100 according to the second embodiment, focusing on the same region as that of FIG. 5. As illustrated in FIG. 9, the sub-array 111 (memory cell array 110) according to the second embodiment has a structure of the sub-array 111 according to the first embodiment, from which contacts VC provided between the even-numbered bit lines BL and memory cells MC are omitted.

In the sub-array 111 according to the second embodiment, the even-numbered bit lines BL are spaced apart from adjacent pairs of even-numbered memory cells MC or adjacent pairs of odd-numbered memory cells MC. In particular, the bit line BL2, when planarly viewed, is spaced apart from the contacts VC coupled to the memory cells MC at coordinate (2), and also from the contacts VC coupled to the memory cells MC at coordinate (4). The bit line BL4, when planarly viewed, is spaced apart from the contacts VC coupled to the memory cells MC at coordinate (5), and from the contacts VC coupled to the memory cells MC at coordinate (7).

<2-1-2> Cross-Sectional Structure of Memory Cell Array 110

FIG. 10 is a cross-sectional view showing an exemplary cross-sectional structure of the memory cell array 110 in the memory device 100 according to the second embodiment, focusing on the same region as that of FIG. 8. As illustrated in FIG. 10, in the structure according to the second embodiment, the odd-numbered bit lines BL of the open-BL arrangement and the even-numbered bit lines BL of the folded-BL arrangement are positioned at different heights.

In particular, the even-numbered bit lines BL according to the second embodiment are positioned at the same height as the contacts VC. That is, the even-numbered bit lines BL and contacts VC are provided in the same interconnect layer. In this case, the odd-numbered bit lines BL and even-numbered bit lines BL are formed at different manufacturing steps. The width of an odd-numbered bit line BL may be the same as, or different from, that of an even-numbered bit line BL. The rest of the structure of the memory device 100 according to the second embodiment is the same as that of the memory device 100 according to the first embodiment.

<2-2> Effects of Second Embodiment

In the memory device 100 according to the second embodiment, the pitch of the bit lines BL of the open-BL arrangement can be widened in comparison with the first embodiment. Furthermore, in the memory device 100 according to the second embodiment, the spacing between a bit line BL of the open-BL arrangement and a bit line BL of the folded-BL arrangement is increased in comparison with the first embodiment. For this reason, according to the second embodiment, noise can be reduced between adjacent bit lines BL of the open-BL arrangement and folded-BL arrangement, in comparison with the first embodiment. As a result, the memory device 100 according to the second embodiment realizes an improved read margin with respect to the first embodiment, and further reduces production costs in comparison with the first embodiment.

<3> Third Embodiment

A memory device 100 according to the third embodiment includes sub-arrays 111 in which some of the bit lines BL are crisscrossed. The memory device 100 according to the third embodiment will be described in detail below.

<3-1> Circuit Configuration of Memory Device 100

The memory device 100 according to the third embodiment has the same configuration as that of the first or second embodiment, except for the circuit configuration of the memory device 100 described below. The first to eighth configuration examples of the memory device 100 according to the third embodiment will be individually described.

First Configuration Example

FIG. 11 is a schematic diagram showing the first configuration example of the memory device 100 according to the third embodiment. In this drawing, the first configuration example, in which eight bit lines BL1 to BL8 and eight word lines WL1 to WL8 in each of the first sub-array 111A and second sub-array 111B, as well as multiple memory cells MC and sense amplifiers SAo and SAf associated with these lines, is illustrated.

In the first configuration example illustrated in FIG. 11, the odd-numbered bit lines BL of the open-BL arrangement are divided into two adjacent groups of bit lines BL. In particular, two bit lines BL1 and BL3 are paired, and two bit lines BL5 and BL7 are paired. In the first configuration example, the first sub-array 111A is divided into two regions, namely the first region RG1 that includes memory cells MC respectively coupled to the word lines WL1 to WL4, and the second region RG2 that includes memory cells MC respectively coupled to the word lines WL5 to WL8. In the first configuration example, the connection between the memory cells MC and bit lines BL in the first region RG1 is the same as that of the first embodiment. The first configuration example, however, differs from the first embodiment in that, with regard to the connection between the bit lines BL and the memory cells MC, the bit lines BL in each pair of bit lines BL crisscross each other between the first region RG1 and the second region RG2. The connection of bit lines BL of the first configuration example will be described, using the X coordinates of the memory cells MC described in FIG. 5.

The bit line BL1 of the first sub-array 111A is coupled to the memory cells MC at coordinates (1) and (2) in the first region RG1 and to the memory cells MC at coordinates (4) and (5) in the second region RG2. On the other hand, the bit line BL3 of the first sub-array 111A is coupled to the memory cells MC at coordinates (4) and (5) in the first region RG1 and to the memory cells MC at coordinates (1) and (2) in the second region RG2. Furthermore, the bit line BL1 of the second sub-array 111B is coupled to the memory cells MC at coordinates (4) and (5) in the first region RG1 and to the memory cells MC at coordinates (1) and (2) in the second region RG2. On the other hand, the bit line BL3 of the second sub-array 111B is coupled to the memory cells MC at coordinates (1) and (2) in the first region RG1 and to the memory cells MC at coordinates (4) and (5) in the second region RG2.

In the above arrangement, the bit lines BL1 to BL3 in the first sub-array 111A are crisscrossed between the first region RG1 and second region RG2 in the first sub-array 111A. Similarly, the bit lines BL1 to BL3 in the second sub-array 111B are crisscrossed between the first region RG1 and second region RG2 in the second sub-array 111B. In the first configuration example, the connection between the even-numbered bit lines BL and the memory cells MC of the folded-BL arrangement is the same as in the first embodiment. For instance, in each of the sub-arrays 111, the bit line BL2 is coupled to the memory cells MC at coordinate (3) only, and the bit line BL4 is coupled to the memory cells MC at coordinate (6). In the first configuration example, the same connection pattern as for coordinates (1) to (6) is repeated for coordinate (7) and subsequent coordinates. Each of the sense amplifiers SAo and sense amplifiers SAf is coupled to a corresponding group of bit lines BL in the same manner as in the first embodiment.

As described above, in the first configuration example, the positions (coordinates) in the X direction of any two adjacent odd-numbered bit lines BL in the second region RG2 are switched from the positions of the two adjacent odd-numbered bit lines BL in the first region RG1.

Throughout this specification, the portions of the bit lines BL that are included in the first region RG1 and the portions of the bit lines BL that are included in the second region RG2 may be referred to as "bit line portions". That is, each bit line BL may be considered to have a bit line portion included in the first region RG1 and a bit line portion included in the second region RG2. In the same manner as in the first embodiment, bit line portions in the first region RG1 and bit line portions in the second region RG2 may be considered to form groups of four bit line portions arranged in the X direction. In each of the first region RG1 and second region RG2, groups each consisting of four bit line portions arranged in the X direction are repeated in the X direction.

In particular, in the first configuration example, the bit lines BL include the first group of the first bit line portion to the fourth bit line portion arranged in the X direction in the first region RG1 and the second group of the fifth bit line portion to the eighth bit line portion arranged in the X direction in the second region RG2. The first groups and second groups are alternately arranged in the X direction. In the first configuration example, the first to fourth bit line portions correspond to the bit lines BL1 to BL4, respectively. Furthermore, the first to fourth bit line portions are respectively adjacent in the Y direction to the fifth to eighth bit line portions. In the first configuration example, in the first and second groups adjacent to each other in the Y direction, the first bit line portion is coupled to the seventh bit line portion, the third bit line portion is coupled to the fifth bit line portion, the second bit line portion is coupled to the sixth bit line portion, and the fourth bit line portion is coupled to the eighth bit line portion.

Furthermore, in the first configuration example, the connection between the memory cells MC and bit lines BL in the second sub-array 111B is similar to a reversed pattern of the connection in the first region RG1 and second region RG2 of the first sub-array 111A. The same applies to the second to eighth configuration examples discussed below. The following description will focus on the circuit configuration of the first sub-array 111A.

Second Configuration Example

FIG. 12 is a schematic diagram showing the second configuration example of the memory cell array 110 in the memory device 100 according to the third embodiment, focusing on the first sub-array 111A. In the second configuration example illustrated in FIG. 12, the even-numbered bit lines BL of the folded-BL arrangement are divided into two adjacent groups of bit lines BL. In particular, two bit lines BL2 and BL4 are paired, and two bit lines BL6 and BL8 are paired. Furthermore, in the same manner as in the first configuration example, each sub-array 111 is divided into the first region RG1 and second region RG2 in the second configuration example.

In the second configuration example, the bit line BL2 in the first sub-array 111A is coupled to the memory cells MC at coordinate (3) in the first region RG1, and to the memory cells MC at coordinate (6) in the second region RG2. On the other hand, the bit line BL4 in the first sub-array 111A is coupled to the memory cells MC at coordinate (6) in the first region RG1, and to the memory cells MC at coordinate (3) in the second region RG2. In the second configuration example, the bit lines BL2 to BL4 in the first sub-array 111A are crisscrossed between the first region RG1 and second region RG2 in the first sub-array 111A. In the second configuration example, the connection between the odd-numbered bit lines BL of the open-BL arrangement and the memory cells MC is the same as in the first embodiment. The same connection pattern as for coordinates (1) to (6) is repeated for coordinate (7) and subsequent coordinates.

As described above, in the second configuration example, the positions (coordinates) in the X direction of any two adjacent even-numbered bit lines BL in the second region RG2 are switched from the positions of the two adjacent even-numbered bit lines BL in the first region RG1.

That is, in the second configuration example, the bit lines BL include, in the same manner as in the first configuration example, the first group of the first to fourth bit line portions in the first region RG1 and the second group of the fifth to eighth bit line portions in the second region RG2. In the second configuration example, the first to fourth bit line portions may correspond to the bit lines BL1 to BL4, respectively. In the second configuration example, the first to fourth bit line portions are respectively adjacent in the Y direction to the fifth to eighth bit line portions. In the second configuration example, in the first and second groups adjacent to each other in the Y direction, the first bit line portion is coupled to the fifth bit line portion, the third bit line portion is coupled to the seventh bit line portion, the second bit line portion is coupled to the eighth bit line portion, and the fourth bit line portion is coupled to the sixth bit line portion.

Third Configuration Example

FIG. 13 is a schematic diagram showing the third configuration example of the memory cell array 110 in the memory device 100 according to the third embodiment, focusing on the first sub-array 111A. The third configuration example is a modification of the second configuration example, where each sub-array 111 is divided into three regions, as illustrated in FIG. 13. In particular, the first sub-array 111A is divided into the first region RG1, second region RG2, and third region RG3. In this example, the first region RG1 is associated with four word lines WL1 to WL4, the second region RG2 is associated with four word lines WL5 to WL8, and the third region RG3 is associated with four word lines WL9 to WL12.

In the third configuration example, the connection between the bit lines BL and memory cells MC in the first region RG1 and second region RG2 is the same as that of the second configuration example. The connection in the third region RG3 in the third configuration example is the same as that of the first region RG1.

In particular, in the third configuration example, the bit line BL2 in the first sub-array 111A is coupled to the memory cells MC at coordinate (3) in the first region RG1, to the memory cells MC at the coordinate (6) in the second region RG2, and to the memory cells MC at coordinate (3) in the third region RG3. On the other hand, the bit line BL4 in the first sub-array 111A is coupled to the memory cells MC at coordinate (6) in the first region RG1, to the memory cells MC at coordinate (3) in the second region RG2, and to the memory cells MC at coordinate (6) in the third region RG3.

In the third configuration example, the bit lines BL2 to BL4 in the first sub-array 111A are crisscrossed between the first region RG1 and second region RG2 and between the second region RG2 and third region RG3. In the third configuration example, the connection between the odd-numbered bit lines BL and the memory cells MC of the open-BL arrangement is the same as in the first embodiment. The same connection pattern as for coordinates (1) to (6) is repeated for coordinate (7) and subsequent coordinates.

As described above, in comparison with the second configuration example, each of the bit lines BL in the third configuration example includes a portion in the third region RG3, which is provided on the side opposite the first region RG1 with respect to the second region RG2. Furthermore, the positions in the X direction of any two adjacent even-numbered bit lines BL in the third region RG3 are switched from the positions of the two adjacent even-numbered bit lines BL in the X direction in the second region RG2. That is, in the third configuration example, in each sub-array 111, the coordinates of the memory cells MC coupled to the paired even-numbered bit lines BL are switched at two locations (even-numbered locations). Thus, in the third configuration example, the asymmetry property of each sub-array 111 can be suitably suppressed in comparison with the second configuration example.

Throughout this specification, the portions of the bit lines BL included in the third region RG3 may be referred to as "bit line portions". That is, each bit line BL may have a bit line portion included in the first region RG1, a bit line portion included in the second region RG2, and a bit line portion included in the third region RG3. In the same manner as in the first embodiment, the bit line portions in the first region RG1, bit line portions in the second region RG2, and bit line portions in the third region RG3 may be considered to be formed by groups of four bit line portions arranged in the X direction. In each of the first region RG1, second region RG2, and third region RG3, groups each consisting of four bit line portions arranged in the X direction are repeated in the X direction.

In particular, in the third configuration example, the bit lines BL include the first group of the first bit line portion to the fourth bit line portion arranged in the X direction in the first region RG1, the second group of the fifth bit line portion to the eighth bit line portion arranged in the X direction in the second region RG2, and the third group of the ninth bit line portion to the twelfth bit line portion arranged in the X direction in the third region RG3. The first group, second group, and third group are alternately repeated in the X direction. In the third configuration example, the first to fourth bit line portions correspond to the bit lines BL1 to BL4, respectively, and the first to fourth bit line portions are respectively adjacent in the Y direction to the fifth to eighth bit line portions. In the third configuration example, the fifth to eighth bit line portions are respectively adjacent in the Y direction to the ninth to twelfth bit line portions. In the first and second groups adjacent to each other in the Y direction, the first bit line portion is coupled to the fifth bit line portion, the third bit line portion is coupled to the seventh bit line portion, the second bit line portion is coupled to the eighth bit line portion, and the fourth bit line portion is coupled to the sixth bit line portion. In the second and third groups adjacent to each other in the Y direction, the fifth bit line portion is coupled to the ninth bit line portion, the sixth bit line portion is coupled to the twelfth bit line portion, the seventh bit line portion is coupled to the eleventh bit line portion, and the eighth bit line portion is coupled to the tenth bit line portion.

Fourth Configuration Example

FIG. 14 is a schematic diagram showing the fourth configuration example of the memory cell array 110 in the memory device 100 according to the third embodiment, focusing on the first sub-array 111A. In the fourth configuration example illustrated in FIG. 14, the connection of the odd-numbered bit lines BL of the first configuration example and the connection of the even-numbered bit lines BL of the second configuration example are combined.

In particular, the bit line BL1 of the fourth configuration example is coupled to the memory cells MC at coordinates (1) and (2) in the first region RG1, and to the memory cells MC at coordinates (4) and (5) in the second region RG2. The bit line BL3 of the fourth configuration example is coupled to the memory cells MC at coordinates (4) and (5) in the first region RG1, and to the memory cells MC at coordinates (1) and (2) in the second region RG2.

In the fourth configuration example, the bit line BL2 is coupled to the memory cells MC at coordinate (3) in the first region RG1, and to the memory cells MC at coordinate (6) in the second region RG2. In the fourth configuration example, the bit line BL4 is coupled to the memory cells MC at coordinate (6) in the first region RG1, and to the memory cells MC at coordinate (3) in the second region RG2.

In the fourth configuration example, the bit line BL1 is crisscrossed with the bit line BL3, and the bit line BL2 is crisscrossed with the bit line BL4 between the first region RG1 and second region RG2. The same connection pattern as for coordinates (1) to (6) is repeated for coordinate (7) and subsequent coordinates.

As described above, in the fourth configuration example, the positions in the X direction of any two adjacent odd-numbered bit lines BL in the second region RG2 are switched from the positions of the two adjacent odd-numbered bit lines BL in the first region RG1. Furthermore, in the fourth configuration example, the positions in the X direction of any two adjacent even-numbered bit lines BL in the second region RG2 are switched from the positions in the X direction of the two adjacent even-numbered bit lines BL in the first region RG1.

That is, in the fourth configuration example, the bit lines BL include, in the same manner as in the first configuration example, the first group of the first to fourth bit line portions in the first region RG1 and the second group of the fifth to eighth bit line portions in the second region RG2. In the fourth configuration example, the first to fourth bit line portions correspond to the bit lines BL1 to BL4, respectively. In the fourth configuration example, the first to fourth bit line portions are respectively adjacent in the Y direction to the fifth to eighth bit line portions. In the fourth configuration example, in the first and second groups adjacent to each other in the Y direction, the first bit line portion is coupled to the seventh bit line portion, the third bit line portion is coupled to the fifth bit line portion, the second bit line portion is coupled to the eighth bit line portion, and the fourth bit line portion is coupled to the sixth bit line portion.

Fifth Configuration Example

FIG. 15 is a schematic diagram showing the fifth configuration example of the memory cell array 110 in the memory device 100 according to the third embodiment, focusing on the first sub-array 111A. The fifth configuration example is a modification of the fourth configuration example, where each sub-array 111 is divided into three regions, as illustrated in FIG. 15. In particular, the first sub-array 111A is divided into the first region RG1, second region RG2, and third region RG3. In this example, the first region RG1 is associated with four word lines WL1 to WL4, the second region RG2 is associated with four word lines WL5 to WL8, and the third region RG3 is associated with four word lines WL9 to WL12.

In the fifth configuration example, the connection between the bit lines BL and memory cells MC in the first region RG1 and second region RG2 is the same as that of the fourth configuration example. The connection in the third region RG3 is the same as that of the first region RG1 in the fifth configuration example.

In particular, in the fifth configuration example, the bit line BL1 in the first region RG1 is coupled to the memory cells MC at coordinates (1) and (2), to the memory cells MC at coordinates (4) and (5) in the second region RG2, and to the memory cells MC at coordinates (1) and (2) in the third region RG3. The bit line BL3 in the first region RG1 in the fifth configuration example is coupled to the memory cells MC at coordinates (4) and (5), to the memory cells MC at coordinates (1) and (2) in the second region RG2, and to the memory cells MC at coordinates (4) and (5) in the third region RG3.

In the fifth configuration example, the bit line BL2 is coupled to the memory cells MC at coordinate (3) in the first region RG1, to the memory cells MC at coordinate (6) in the second region RG2, and to the memory cells MC at coordinate (3) in the third region RG3. The bit line BL4 in the fifth configuration example is coupled to the memory cells MC at coordinate (6) in the first region RG1, to the memory cells MC at coordinate (3) in the second region RG2, and to the memory cells MC at coordinate (6) in the third region RG3.

In the fifth configuration example, the bit line BL1 is crisscrossed with the bit line BL3, and the bit line BL2 is crisscrossed with the bit line BL4, between the first region RG1 and second region RG2 and between the second region RG2 and third region RG3. The same connection pattern as for coordinates (1) to (6) is repeated for coordinate (7) and subsequent coordinates.

As described above, in comparison with the fourth configuration example, each of the bit lines BL in the fifth configuration example includes a portion in the third region RG3, which is provided on the side opposite the first region RG1 with respect to the second region RG2. Furthermore, the positions in the X direction of any two adjacent odd-numbered bit lines BL in the third region RG3 are switched from the positions in the X direction of the two adjacent odd-numbered bit lines BL in the second region RG2. Furthermore, in the fifth configuration example, the positions in the X direction of any two adjacent even-numbered bit lines BL in the third region RG3 are switched with respect to the positions in the X direction of the two adjacent even-numbered bit line BL in the second region RG2. That is, in the fifth configuration example, in each of the sub-arrays 111, the coordinates of the memory cells MC coupled to the paired odd-numbered bit lines BL are switched at two locations (even number of locations), and the coordinates of the memory cells MC coupled to the paired even-numbered bit line BL are also switched at two locations (even number of locations).

That is, in the fifth configuration example, the bit lines BL include, in the same manner as in the third configuration example, the first group of the first to fourth bit line portions included in the first region RG1, the second group of the fifth to eighth bit line portions included in the second region RG2, and the third group of the ninth to twelfth bit line portions in the third region RG3. In the fifth configuration example, the first to fourth bit line portions correspond to the bit lines BL1 to BL4, respectively, and the first to fourth bit line portions are respectively adjacent in the Y direction to the fifth to eighth bit line portions. The fifth to eighth bit line portions are respectively adjacent in the Y direction to the ninth to twelfth bit line portions. In the fifth configuration example, in the first and second groups adjacent to each other in the Y direction, the first bit line portion is coupled to the seventh bit line portion, the third bit line portion is coupled to the fifth bit line portion, the second bit line portion is coupled to the eighth bit line portion, and the fourth bit line portion is coupled to the sixth bit line portion. In the fifth configuration example, in the second and third groups adjacent to each other in the Y direction, the fifth bit line portion is coupled to the eleventh bit line portion, the sixth bit line portion is coupled to the twelfth bit line portion, the seventh bit line portion is coupled to the ninth bit line portion, and the eighth bit line portion is coupled to the tenth bit line portion. Thus, in the fifth configuration example, the asymmetry property of the sub-array 111 can be further adjusted in comparison with the fourth configuration example.

Sixth Configuration Example

FIG. 16 is a schematic diagram showing the sixth configuration example of the memory cell array 110 in the memory device 100 according to the third embodiment, focusing on the first sub-array 111A. In the same manner as in the first configuration example, each sub-array 111 is divided into the first region RG1 and second region RG2 in the sixth configuration example, as illustrated in FIG. 16. Furthermore, in the sixth configuration example, the even-numbered bit lines BL of the folded-BL arrangement in the first region RG1 are respectively shifted to the positions at the coordinates of the next even-numbered bit lines BL in the second region RG2 to establish connections.

In particular, in the sixth configuration example, the bit line BL2 is coupled to the memory cells MC at coordinate (3) in the first region RG1, and to the memory cells MC at coordinate (6) in the second region RG2. The bit line BL4 in the sixth configuration example is coupled to the memory cells MC at coordinate (6) in the first region RG1, and to the memory cells MC at coordinate (9) in the second region RG2. The bit line BL6 in the sixth configuration example is coupled to the memory cells MC at coordinate (9) in the first region RG1, and to the memory cells MC at coordinate (12) in the second region RG2. In a similar manner, the bit line BL(2*k) (where k is an integer larger than or equal to 1) in the sixth configuration example is coupled to the memory cells MC at coordinate (3*k) in the first region RG1, and to the memory cells MC at coordinate (3*(k+1)) in the second region RG2. In the sixth configuration example, the connection between the odd-numbered bit lines BL and the memory cells MC of the open-BL arrangement is the same as in the first embodiment.

As described above, in the sixth configuration example, the positions of the even-numbered bit lines BL in the X direction in the second region RG2 are shifted from the positions of the adjacent even-numbered bit lines BL in the X direction in the first region RG1.

That is, in the same manner as in first configuration example, the bit lines BL in the sixth configuration example include the first group of the first to fourth bit line portions in the first region RG1 and the second group of the fifth to eighth bit line portions in the second region RG2. In the sixth configuration example, the first to fourth bit line portions correspond to the bit lines BL1 to BL4, respectively, and the first to fourth bit line portions are respectively adjacent in the Y direction to the fifth to eighth bit line portions. In the first and second groups adjacent to each other in the Y direction of the sixth configuration example, the first bit line portion is coupled to the fifth bit line portion, the third bit line portion is coupled to the seventh bit line portion, the second bit line portion is coupled to the eighth bit line portion, and the fourth bit line portion is coupled to the sixth bit line portion included in the adjacent second group. In the sixth configuration example, the interconnect that mutually connects the second bit line portion and the eighth bit line portion does not cross the interconnects that mutually connect the fourth bit line portion and the sixth bit line portion.

Seventh Configuration Example

FIG. 17 is a schematic diagram showing the seventh configuration example of the memory cell array 110 in the memory device 100 according to the third embodiment, focusing on the first sub-array 111A. In the same manner as in the first configuration example, each sub-array 111 is divided into the first region RG1 and second region RG2 in the seventh configuration example, as illustrated in FIG. 17. Furthermore, in the seventh configuration example, the odd-numbered bit lines BL of the open-BL arrangement in the first region RG1 are respectively shifted to the positions at the coordinates of the next odd-numbered bit lines BL in the second region RG2 to establish connections.

In particular, the bit line BL1 of the seventh configuration example is coupled to the memory cells MC at coordinates (1) and (2) in the first region RG1, and to the memory cells MC at coordinates (4) and (5) in the second region RG2. The bit line BL3 of the seventh configuration example is coupled to the memory cells MC at coordinates (4) and (5) in the first region RG1, and to the memory cells MC at coordinates (7) and (8) in the second region RG2. The bit line BL5 in the seventh configuration example is coupled to the memory cells MC at coordinates (7) and (8) in the first region RG1, and to the memory cells MC at coordinates (10) and (11) in the second region RG2. In a similar manner, in the seventh configuration example, the bit line BL(2*k−1) (where k is an integer larger than or equal to 1) is coupled to the memory cells MC at coordinates (3*k−2) and (3*k−1) in the first region RG1 and to the memory cells MC at coordinates (3*(k+1)−2) and (3*(k+1)−1) in the second region RG2. In the seventh configuration example, the connection between the even-numbered bit lines BL and the memory cells MC of the folded-BL arrangement is the same as in the first embodiment.

As described above, in the seventh configuration example, the positions of the odd-numbered bit lines BL in the X direction in the second region RG2 are shifted from the positions of the adjacent odd-numbered bit lines BL in the X direction in the first region RG1.

That is, in the seventh configuration example, the bit lines BL include, in the same manner as in the first configuration example, the first group of the first to fourth bit line portions in the first region RG1 and the second group of the fifth to eighth bit line portions in the second region RG2. In the seventh configuration example, the first to fourth bit line portions correspond to the bit lines BL1 to BL4, respectively, and the first to fourth bit line portions are respectively adjacent in the Y direction to the fifth to eighth bit line portions. In the seventh configuration example, in the first and second groups adjacent to each other in the Y direction, the first bit line portion is coupled to the seventh bit line portion, the third bit line portion is coupled to the fifth bit line portion included in the adjacent second group, the second bit line portion is coupled to the sixth bit line portion, and the fourth bit line portion is coupled to the eighth bit line portion. In the seventh configuration example, the interconnect that mutually connects the first bit line portion and the seventh bit line portion does not crisscross the interconnect that mutually connects the third bit line portion and the fifth bit line portion.

Eighth Configuration Example

FIG. 18 is a schematic diagram showing the eighth configuration example of the memory cell array 110 in the memory device 100 according to the third embodiment, focusing on the first sub-array 111A. In the same manner as in the first configuration example, each sub-array 111 is divided into the first region RG1 and second region RG2 in the eighth configuration example, as illustrated in FIG. 18. This drawing indicates X coordinates (1) to (12) in the first region RG1 and X coordinates (1) to (12) in the second region RG2. In the eighth configuration example, two adjacent bit lines BL are switched with each other between the first region RG1 and the second region RG2. In particular, the bit line BL1 of the eighth configuration example is coupled to the memory cells MC at coordinates (1) and (2) in the first region RG1, and to the memory cells MC at coordinates (2) and (3) in the second region RG2. The bit line BL2 in the eighth configuration example is coupled to the memory cells MC at coordinate (3) in the first region RG1, and to the memory cells MC in the coordinate (1) in the second region RG2. The same connection pattern as for coordinates (1) to (3) is repeated for coordinate (4) and subsequent coordinates.

In other words, in the eighth configuration example, the bit line BL(2*k−1) (where k is an integer larger than or equal to 1) is coupled to the memory cells MC at coordinates (3*k−2) and (3*k−1) in the first region RG1, and to the memory cells MC at coordinates (3*k−1) and (3*k) in the second region RG2. In the eighth configuration example, the bit line BL(2*k) (where k is an integer larger than or equal to 1) is coupled to the memory cells MC at coordinate (3*k) in the first region RG1 and to the memory cells MC at coordinate (3*k−2) in the second region RG2.

As described above, in the eighth configuration example, the connection assignment of memory cells MC (cell transistors CT) in the second region RG2 is switched with the connection assignment of memory cells MC (cell transistors CT) in the first region RG1 for every adjacent pair of an odd-numbered bit line BL and an even-numbered bit line BL.

That is, in the eighth configuration example, the bit lines BL include, in the same manner as in the first configuration example, the first group of the first to fourth bit line portions in the first region RG1 and the second group of the fifth to eighth bit line portions in the second region RG2. In the eighth configuration example, the first to fourth bit line portions correspond to the bit lines BL1 to BL4, respectively. In the eighth configuration example, in the first and second groups adjacent to each other in the Y direction, the positions of the fifth bit line portion and sixth bit line portion are switched, the positions of the seventh bit line portion and eighth bit line portion are switched, and the first to fourth bit line portions are coupled to the fifth to eighth bit line portions, respectively. In this connection, the interconnect that mutually connects the first bit line portion and fifth bit line portion crisscrosses the interconnect that mutually connects the second bit line portion and sixth bit line portion in the eighth configuration example. Similarly, the interconnect that mutually connects the third bit line portion and seventh bit line portion crisscrosses the interconnect that mutually connects the fourth bit line portion and eighth bit line portion in the eighth configuration example. The "positions of two bit line portions being switched" denotes the positions of the two bit line portions interchanged while the correspondence (of the open-BL or folded-BL arrangement) of memory cells MC connected to these bit line portions is unchanged.

<3-2> Configuration of Memory Device 100

The configuration of the memory device 100 according to the third embodiment will be explained with reference to the second and eighth configuration examples.

Second Configuration Example

FIG. 19 is a plan view showing an exemplary planar layout of the second configuration example of a memory cell array 110 included in the memory device 100 according to the third embodiment, focusing on the first sub-array 111A. FIG. 19 shows five bit lines BL1 to BL5 and eight word lines WL1 to WL8, as well as memory cells MC and contacts VC associated with these lines in the first sub-array 111A of the second configuration example.

As illustrated in FIG. 19, the bit line BL1 includes a first portion 40 provided in the first region RG1 and a second portion 50 provided in the second region RG2. The bit line BL2 includes a first portion 41 provided in the first region RG1 and a second portion 51 provided in the second region RG2. The bit line BL3 includes a first portion 42 provided in the first region RG1 and a second portion 52 provided in the second region RG2. The bit line BL4 includes a first portion 43 provided in the first region RG1 and a second portion 53 provided in the second region RG2. In the second configuration example, an interconnect region WR is arranged between the first region RG1 and second region RG2. The first sub-array 111A further includes shunts SH1 and SH2 and multiple contact CP3 in this interconnect region WR. The shunts SH1 and SH2 are conductors and formed of a metal, for example. The shunt SH1 is spaced apart from the shunt SH2. The shunts SH1 and SH2 are provided in association with the bit lines BL3 and BL4, respectively.

In the second configuration example, the first portion 40 and second portion 50 of the bit line BL1 are continuously formed across the interconnect region WR, and the first portion 41 and second portion 51 of the bit line BL2 are continuously formed across the interconnect region WR. A contact CP3 is coupled to each of the first portion 42 and second portion 52 of the bit line BL3 in the second configuration example. The shunt SH1 mutually couples the contact CP3 coupled to the first portion 42 of the bit line BL3 and the contact CP3 coupled to the second portion 52 of the bit line BL3. That is, an electrical connection is established between the first portion 42 and second portion 52 of the bit line BL3 by way of two contacts CP3 and a shunt SH1. Similarly, a contact CP3 is coupled to each of the first portion 43 and second portion 53 of the bit line BL4 in the second configuration example. The shunt SH2 mutually couples the contact CP3 coupled to the first portion 43 of the bit line BL4 and the contact CP3 coupled to the second portion 53 of the bit line BL4. That is, an electrical connection is established between the first portion 43 and second portion 53 of the bit line BL4 by way of two contacts CP3 and a shunt SH2. For the bit line BL5 and subsequent bit lines, the same configuration of the bit lines BL1 to BL4 is repeated.

The planar shape of the shunts SH1 and SH2 is not particularly limited. Any shape sufficient to electrically connect the bit line BL of the first region RG1 and the bit line BL of the second region RG2 can be adopted. For instance, the configuration may be such that the second portion 52 of the bit line BL3 extends with its one end reaching a position between the first portion 41 of the bit line BL2 and the second portion 53 of the bit line BL4. A contact CP3 is coupled to this end of the second portion 52 of the bit line BL3. The portion of the bit line BL2 in the interconnect region WR has, for example, a cranked planar shape. The bit line BL2 is spaced apart from the bit line BL3 and from the bit line BL4. The second configuration example can mutually couple the portions of the lines that cross each other in the first region RG1 and second region RG2, while reducing the width of the interconnect region WR in the Y direction.

FIG. 20 is a cross-sectional view showing an exemplary cross-sectional structure of the second configuration example of the memory cell array 110 (first sub-array 111A) in the memory device 100 of the third embodiment, taken along line XX-XX indicated in FIG. 19. In particular, the connection portion of the first portion 43 and the second portion 53 of the bit line BL4 is illustrated in FIG. 20. As illustrated in FIG. 20, two contacts CP3 are provided, one on the first portion 43 of the bit line BL4 and the other on the second portion 53 of the bit line BL4. A shunt SH2 is provided on the two contacts CP3, for example at a height above the bit line BL. In this example, the bit lines BL2 and BL3 that cross the bit line BL4 are deposited between the shunt SH2 and the plate line PL. In the second configuration example, at least one of the bit lines BL that cross each other between the first region RG1 and second region RG2 establishes an electrical connection between the first region RG1 and second region RG2 by way of a shunt SH that is deposited at a height above the bit line BL.

In the second configuration example, the bit lines BL that incorporate a shunt SH are not limited to the above-mentioned ones. A shunt SH can be used in any manner so as to realize the connection of bit lines BL in the second configuration example. Furthermore, the connection of bit lines BL between the first region RG1 and second region RG2 incorporating shunts SH as described in the second configuration example is equally applicable to any of the first and third to eighth configuration examples.

Eighth Configuration Example

FIG. 21 is a plan view showing an exemplary planar layout of the eighth configuration example of a memory cell array 110 included in the memory device 100 according to the third embodiment, focusing on the first sub-array 111A. FIG. 21 shows five bit lines BL1 to BL5 and eight word lines WL1 to WL8, as well as memory cells MC and contacts VC associated with these lines in the first sub-array 111A of the eighth configuration example. The eighth configuration example will be described, focusing on points that differ from the second configuration example.

In the eighth configuration example illustrated in FIG. 21, the first portion 40 and second portion 50 of the bit line BL1 are continuously formed across the interconnect region WR, and the first portion 42 and second portion 52 of the bit line BL3 are continuously formed across the interconnect region WR. Respective contacts CP3 are coupled to the first portion 41 and the second portion 51 of the bit line BL2 in the eighth configuration example. A shunt SH1 is provided to mutually couple the contact CP3 coupled to the first portion 41 of the bit line BL2 and the contact CP3 coupled to the second portion 51 of the bit line BL2. That is, an electrical connection is established between the first portion 41 and second portion 51 of the bit line BL2 by way of the two contacts CP3 and shunt SH1. Similarly, respective contacts CP3 are coupled to the first portion 43 and second portion 53 of the bit line BL4 in the eighth configuration example, and a shunt SH2 is provided to mutually couple the contact CP3 coupled to the first portion 43 of the bit line BL4 and the contact CP3 coupled to the second portion 53 of the bit line BL4. That is, an electrical connection is established between the first portion 43 and second portion 53 of the bit line BL4 by way of the two contacts CP3 and shunt SH2. For the bit line BL5 and subsequent bit lines, the same configuration of the bit lines BL1 to BL4 is repeated.

In the eighth configuration example, the bit line BL1 is displaced by one coordinate in the X direction while extending between the first region RG1 and the second region RG2, and the bit line BL3 is displaced one coordinate in the X direction while extending between the first region RG1 and the second region RG2. That is, in the eighth configuration example, the bit lines BL are displaced as they extend from the first region RG1 to the second region RG2 so that the positions of an odd-numbered bit line BL of the open-BL arrangement and an even-numbered bit line BL of the folded-BL arrangement are switched. A shunt SH may be incorporated in odd-numbered bit lines BL instead of even-numbered bit lines BL. The displacement of the bit lines BL may be performed in a positive direction or a negative direction of the X axis.

<3-3> Effects of Third Embodiment

At the time of restoring, noise is produced in a read-target bit line BL and a reference bit line BL of the folded-BL arrangement, between which a bit line BL of the open-BL arrangement is interposed. The noise components, however, are oriented in opposing directions and therefore can cancel out each other. On the other hand, in a bit line BL of the open-BL arrangement that is not positioned between the read-target bit line BL and reference bit line BL of the folded-BL arrangement, noise components from the adjacent bit lines BL of two different folded-BL arrangement sets cannot cancel out each other.

According to the third embodiment, the memory device 100 has a structure in which multiple bit lines are crossed in the sub-arrays 111. This can improve the symmetrical property of the noise caused due to coupling in the bit lines BL of the open-BL arrangement arranged between any two adjacent bit lines BL of the folded-BL arrangement in the memory device 100 according to the third embodiment. As a result, the memory device 100 according to the third embodiment can reduce the asymmetry of noise from the adjacent bit lines BL, thereby further improving the read margin in comparison with the first embodiment.

<4> Fourth Embodiment

A memory device 100 according to the fourth embodiment has a configuration in which the arrangement of bit lines BL described in the third embodiment is realized by adopting interconnects deposited at the height of the word lines WL. The memory device 100 according to the fourth embodiment will be described below in detail.

<4-1> Configuration of Memory Device 100

<4-1-1> Planar Layout of Memory Cell Array 110

FIG. 22 is a plan view showing an exemplary planar layout of a memory cell array 110 (first sub-array 111A) in the memory device 100 according to the fourth embodiment, focusing on the first sub-array 111A. FIG. 22 shows five bit lines BL1 to BL5, two word lines WL3 and WL4 included in the first region RG1, two word lines WL5 and WL6 included in the second region RG2, and multiple memory cells MC and contacts VC associated with these lines in the first sub-array 111A according to the fourth embodiment. As illustrated in FIG. 22, the memory device 100 according to the fourth embodiment differs from that of the third embodiment in the structure of the interconnect region WR, where the contacts CP3 are replaced with contacts CP4, and the shunts SH1 and SH2 are replaced with shunts SHa1 and SHa2.

The shunts SHa1 and SHa2 are conductors and are formed of a material corresponding to the structure of the interconnect region WR. The shunt SHa1 is spaced apart from the shunt SHa2. The shunts SHa1 and SHa2 are provided in association with the bit lines BL3 and BL4, respectively. The shunts SHa1 and SHa2 are provided at the same height as the word lines WL. A contact CP4 couples the shunt SHa1 or SHa2 to the end of the corresponding bit line BL.

According to the fourth embodiment, in particular, a contact CP4 is coupled to each of the first portion 42 and second portion 52 of the bit line BL3 so that the shunt SHa1 mutually couples the contact CP4 coupled to the first portion 42 of the bit line BL3 and the contact CP4 coupled to the second portion 52 of the bit line BL3. That is, an electrical connection is established between the first portion 42 and second portion 52 of the bit line BL3 by way of the two contacts CP4 and the shunt SHa1. Similarly, according to the fourth embodiment, a contact CP4 is coupled to each of the first portion 43 and second portion 53 of the bit line BL4 so that the shunt SHa2 mutually couples the contact CP4 coupled to the first portion 43 of the bit line BL4 and the contact CP4 coupled to the second portion 53 of the bit line BL4. That is, an electrical connection is established between the first portion 43 and second portion 53 of the bit line BL4 by way of the two contacts CP4 and the shunt SHa2. For the bit line BL5 and subsequent bit lines, the same configuration of the bit lines BL1 to BL4 is repeated. The planar shape of the shunts SHa1 and SHa2 is not particularly limited, and any shape sufficient to electrically connect the bit line BL of the first region RG1 and the bit line BL of the second region RG2 can be adopted.

<4-1-2> Cross-Sectional Structure of Memory Cell Array 110

The cross-sectional structure of the memory cell array 110 in the memory device 100 according to the fourth embodiment will be explained below in connection with the first to third examples.

First Example

FIG. 23 is a cross-sectional view showing the cross-sectional structure of the memory cell array 110 (first sub-array 111A) in the memory device 100 according to the fourth embodiment, taken along line XXIII-XXIII of FIG. 22. In particular, the connection portion of the first portion 43 and second portion 53 of the bit line BL4 is illustrated in FIG. 23. As illustrated in FIG. 23, the two contacts CP4 are provided at the same height as the semiconductor layer 10 and gate insulating layer 11 provided in association with cell transistors CT. That is, in this example, each contact CP4 has a bottom end at the same height as the bottom ends of the semiconductor layer 10 and gate insulating layer 11, and a top end at the same height as the top ends of the semiconductor layer 10 and gate insulating layer 11. The contacts CP4 include a conductive layer 13. The conductive layer 13 may be a conductor, for example, metal, metal compound or semiconductor doped with an impurity such as a p-type or an n-type dopant.

A contact VC may be provided on each conductive layer 13. The associated bit line BL is partially in contact with the contact VC on the conductive layer 13. In particular, the bottom surface of the first portion 43 of the bit line BL4 is electrically connected to the conductive layer 13 (contact CP4) in the interconnect region WR with the contact VC interposed. The bottom surface of the second portion 53 of the bit line BL4 is electrically connected to the conductive layer 13 (contact CP4) in the interconnect region WR with the contact VC interposed.

Each contact CP4 penetrates its corresponding shunt SH. In particular, the conductive layer 13 provided beneath the first portion 43 of the bit line BL4 and the conductive layer 13 provided beneath the second portion 53 of the bit line BL4 penetrate the same shunt SHa2 and are electrically connected to this shunt. In this manner, an electrical connection is established in the bit line BL4 between the first region RG1 and second region RG2 with the two contacts CP4 and shunt SHa2 interposed.

In the memory device 100 of the first example, there is no structure similar to that of a cell capacitor CC beneath the contacts CP4. In other words, dummy cell capacitors CC are omitted from the interconnect region WR (beneath the contacts CP4, in particular) in the memory device 100 of the first example. A "dummy cell capacitor CC" is a structure arranged in the process of forming cell capacitors CC simply to form suitable holes for the cell capacitors CC. If the cell capacitors CC can be suitably formed, dummy cell capacitors CC can be omitted.

In the formation of pillar-shaped contacts CP4, a step is adopted of forming holes (channel holes) for cell transistors CT. In particular, the formation of holes corresponding to the cell transistors CT and the formation of holes corresponding to contacts CP4 are performed at the same time, and the structure corresponding to the cell transistors CT and the structure corresponding to the contacts CP4 are separately formed. This is not a limitation, however, and any other production process can be adopted if the configuration of the memory device 100 of the first example can be realized. Furthermore, holes for the contacts CP4 do not need to be provided at the same pitch as that of the channel holes.

If a connection between the first portion 43 and second portion 53 of the bit line BL4 can be established with the shunt SHa2, contacts VC coupled to the shunt SHa2 may be omitted. In the first example, the bit lines BL that incorporate shunts SHa are not limited to the above-mentioned ones. Shunts SHa can be adopted in any manner so as to realize the connection of bit lines BL of the first example. Furthermore, the connection of bit lines BL between the first region RG1 and second region RG2 using shunts SHa of the first example is equally applicable to any of the first to eighth configuration examples of the third embodiment.

Second Example

FIG. 24 is a cross-sectional view showing the second example of the cross-sectional structure of the memory cell array 110 (first sub-array 111A) in the memory device 100 according to the fourth embodiment, focusing on the region similar to that of FIG. 23. As illustrated in FIG. 24, the first sub-array 111A of the second example differs from that of the first example in the structure of a contact CP4. In particular, the contacts CP4 of the second example include a semiconductor layer 10 having the same composition as the cell transistors CT. That is, each of the contacts CP4 of the second example has a structure of a cell transistor CT from which the gate insulating layer 11 is omitted, and a material used for a channel is embedded. The top end of the semiconductor layer 10 in the contact CP4 may be in contact with the contact VC. The semiconductor layer 10 in the contact CP4 is coupled to the corresponding bit line BL with a contact VC interposed.

The semiconductor layer 10 of each contact CP4 penetrates the corresponding shunt SH. In particular, the semiconductor layer 10 beneath the first portion 43 of the bit line BL4 and the semiconductor layer 10 beneath the second portion 53 of the bit line BL4 penetrate the same shunt SHa2 and are electrically connected to each other. In this manner, the bit line BL4 establishes an electrical connection between the first region RG1 and second region RG2 with the two contacts CP4 and the shunt SHa2 interposed. In the second example, the memory device 100 does not have a structure similar to a cell capacitor CC underneath the contacts CP4, and the rest of the configuration of the memory cell array 110 of the second example is the same as the first example.

Contacts VC coupled to the shunt SHa2 may be omitted if a connection can be established between the first portion 43 and second portion 53 of the bit line BL4 with the shunt SHa2. In the second example, the bit lines BL that use a shunt SHa are not limited to the above-mentioned ones. Shunts SHa can be used in any manner so as to realize the connection of the bit lines BL of the second example. Furthermore, the connection of bit lines BL between the first region RG1 and second region RG2 using shunts SHa of the second example is equally applicable to any of the first to eighth configuration examples of the third embodiment.

Third Example

FIG. 25 is a cross-sectional view showing the third example of the cross-sectional structure of the memory cell array 110 (first sub-array 111A) in the memory device 100 according to the fourth embodiment, focusing on the region similar to that of FIG. 23. As illustrated in FIG. 25, the first sub-array 111A of the third example differs from that of the first example, in that multiple dummy cell capacitors CC (dummy pillars DP) are formed in the interconnect region WR and that the contacts CP4 have a different structure. Each of the dummy pillars DP has a structure similar to the cell capacitors CC. The contacts CP4 of the third example are spaced apart from the dummy pillar DP.

In particular, the bottom end of a contact CP4 arranged above a dummy pillar DP is spaced apart from the top end of the dummy pillar DP. The top end of the contact CP4 in the third example may be at the same height as the top end of a cell transistor CT (semiconductor layer 10). In the third example, the contact CP4 may include a conductive layer 14. For the conductive layer 14, the semiconductor layer 10 or conductive layer 13 may be adopted, and any material that can achieve an electrical connection with the shunt SHa2 may be adopted. The rest of the configuration of the memory cell array 110 of the third example is the same as the first example.

Contacts VC coupled to the shunt SHa2 may be omitted if a connection between the first portion 43 and second portion 53 of the bit line BL4 can be established with the shunt SHa2 interposed. In the third example, the conductive layers 14 may not penetrate the shunt SHa2. In this case, the contacts CP4 (conductive layers 14) will be provided on the shunt SHa2. In the third configuration example, the bit lines BL that use a shunt SHa are not limited to the above-mentioned ones. Shunts SHa can be used in any manner so as to realize the connection of bit lines BL of the third example. Furthermore, the connection of the bit lines BL between the first region RG1 and second region RG2 using shunts SHa of the third example is equally applicable to any of the first to eighth configuration examples of the third embodiment.

<4-2> Effects of Fourth Embodiment

The memory device 100 according to the fourth embodiment realizes crisscrossing of bit lines BL in the sub-array 111 as in the third embodiment, using the interconnect layers of word lines WL. The memory device 100 according to the fourth embodiment therefore can reduce the production steps and costs of the memory device 100 in comparison with the third embodiment.

<5> Others

In the drawings discussed in the above embodiments, cell capacitors CC, cell transistors CT, and contacts CP are illustrated as having the same diameters in the Z direction, which is not a limitation. These components may have a tapered shape, a reverse-tapered shape, or a bowed shape.

Figure 26:
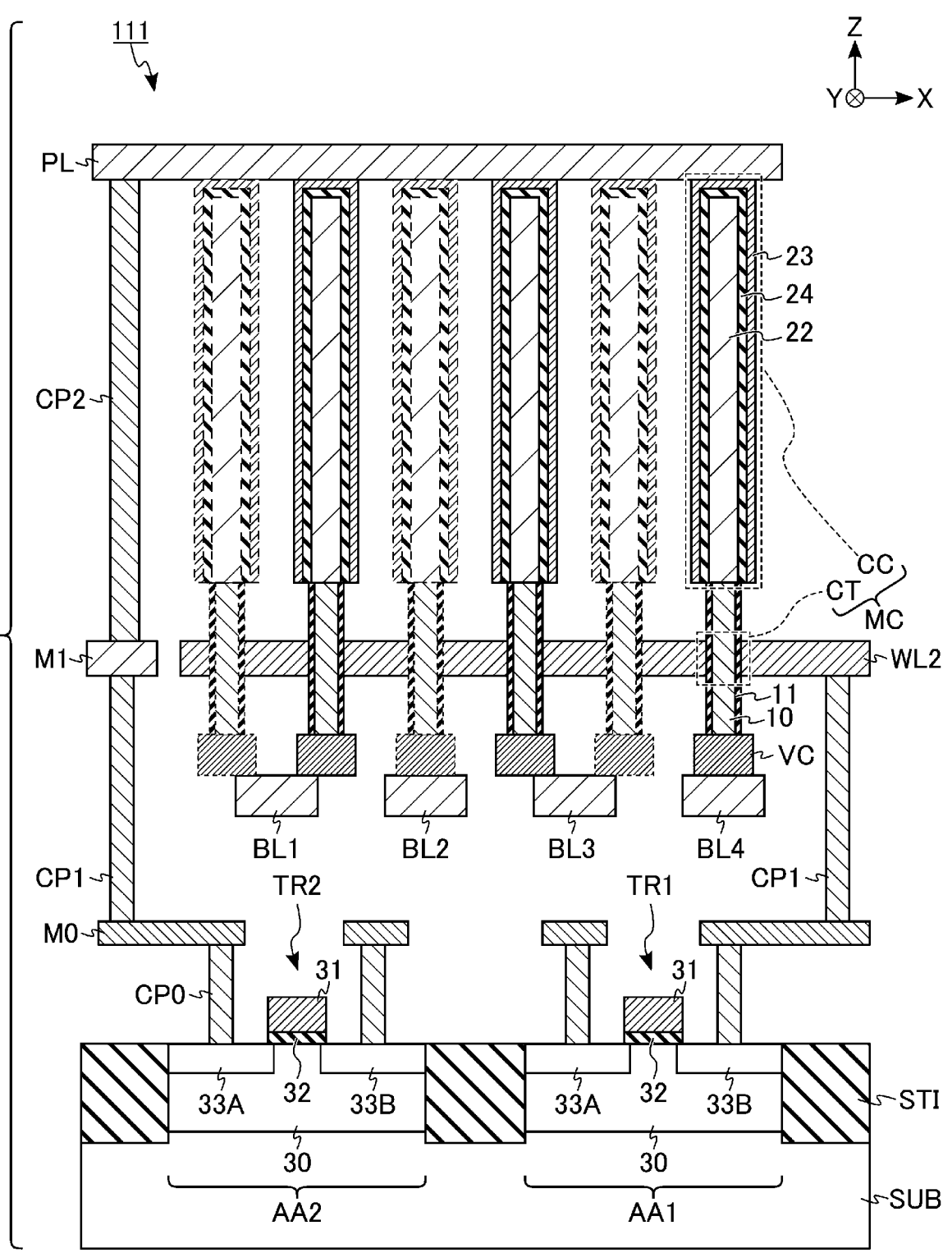
FIG. 26 is a cross-sectional view showing an exemplary cross-sectional structure of a memory cell array in a memory device according to a modification example.

In the above embodiments, the circuit configuration, planar layout, and cross-sectional structure of the memory device 100 may be suitably changed. A CMOS circuit including the transistors TR1 and TR2 and the like does not need to be provided on the semiconductor substrate SUB beneath the cell capacitors CC, and may be arranged on the semiconductor substrate SUB in the vicinity of the cell capacitors CC. The memory device 100 may have a structure in which a group of the plate line PL, memory cells MC, word lines WL, and bit lines BL are reversed in an upside-down manner. FIG. 26 is a cross-sectional view showing an exemplary cross-sectional structure of the memory cell array 110 included in the memory device 100 according to a modification example. As shown in FIG. 26, the memory device 100 may have a structure in which bit lines BL, word lines WL, cell capacitors CC, and a plate line PL are provided in this order above the semiconductor substrate SUB. In the modification example, the plate line PL is electrically connected to the interconnect M0 with a contact CP1, an interconnect M1, and a contact CP2 interposed. The word line WL is electrically connected to the interconnect M0 with the contact CP1 interposed. In this modification example, the contact CP1 may be divided into multiple contacts, on which interconnects may be deposited.

In the description of the first embodiment, the odd-numbered bit lines BL are associated with the bit lines BL of the open-BL arrangement, while the even-numbered bit lines BL are associated with the bit lines BL of the folded-BL arrangement. This is not a limitation, however, and the even/odd numbers of bit lines BL can be defined with reference to a bit line BL at any position. For this reason, in the above embodiments, odd-numbered bit lines BL may be exchanged with even-numbered bit lines BL. Similarly, in the above embodiments, the odd-numbered word lines WL may be exchanged with even-numbered word lines WL.

Throughout the specification, the expression "connection (connected)" refers to electrical connection, which may include connection by way of other elements. The expression "electrically connected" may be connecting components with an insulator interposed if the components are able to operate in the same manner as when being electrically connected. The "tapered shape" indicates a shape that becomes narrower as it becomes farther away from the substrate, which serves as a reference position. The "reverse-tapered shape" indicates a shape that becomes broader as it becomes farther away from the substrate, which is the reference position. A "pillar" indicates a structure provided in a hole formed in the process of producing the memory device 100. The "width" may indicate a length of a structural component in the X direction or Y direction. The "semiconductor layer" may also be referred to as a "conductive layer". The "Z direction" may also be referred to as the extending direction of the channel of a vertical transistor.

Throughout the specification, a "region" may be considered to be a component included in the substrate that serves as a reference position. The "height" corresponds, for example, to a distance between the measurement target component and the semiconductor substrate SUB in the Z direction. As the reference of "height", any component other than the semiconductor substrate SUB may be used. The "planar position" refers to the position of a structural component in the planar layout. "Viewed from the upper surface (or viewed on the planar surface)" indicates that the semiconductor substrate SUB is viewed from the plate line PL. "Data restoring" means that the read-out data is written back into a memory cell MC in the DRAM. In the DRAM, when reading out data, the data stored in a memory cell MC is destroyed, and therefore the data restoring is needed.

The embodiments of the present invention have been explained. These are presented merely as examples and are not intended to restrict the scope of the invention. These novel embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

What is claimed is:

1. A memory device, comprising:
   a plurality of word lines each extending in a first direction and arranged in a second direction crossing the first direction;
   a plurality of bit lines each extending in the second direction and arranged in the first direction;
   a plurality of transistors, each including a channel that extends in a third direction crossing the first direction and the second direction;
   a plurality of capacitors each including two electrodes one of which is coupled to one end of a corresponding one of the transistors; and
   a plate line to which the other one of the electrodes of each of the capacitors is coupled,
   wherein the transistors include a plurality of first transistors and a plurality of second transistors, the first transistors each having a gate end coupled to a first word line of the word lines, the second transistors each having a gate end coupled to a second word line of the word lines that is adjacent to the first word line, the first transistors and the second transistors being arranged to alternate each other in the first direction, and
   the bit lines include first to fourth bit lines arranged sequentially in the first direction, each of the first bit line and the third bit line being coupled to the other end of a corresponding one of the first transistors and to the other end of a corresponding one of the second transistors, the second bit line being coupled to the other end of a corresponding one of the first transistors and not coupled to the other end of any of the second transistors, and the fourth bit line being coupled to the other end of a corresponding one of the second transistors and not coupled to the other end of any of the first transistors.

2. The memory device of claim 1, wherein
   the bit lines include groups of bit lines, each of the groups including the first bit line, the second bit line, the third bit line, and the fourth bit line, and
   the groups are repeatedly arranged in the first direction.

3. The memory device of claim 2, further comprising:
   a plurality of first contacts including a first contact coupling the first bit line and one of the first transistors to each other, a first contact coupling the first bit line and one of the second transistors to each other, a first contact coupling the third bit line and one of the first transistors to each other, and a first contact coupling the third bit line and one of the second transistors to each other.

4. The memory device of claim 3, wherein
the first contacts further include a first contact coupling
the second bit line and one of the first transistors to each
other and a first contact coupling the fourth bit line and
one of the second transistors to each other.

5. The memory device of claim 3, wherein
each of the second bit line and the fourth bit line is
provided at a same height as the first contacts.

6. The memory device of claim 1, wherein
each of the transistors includes a semiconductor layer
provided to extend in the third direction and a gate
insulating layer provided between the semiconductor
layer and one of the word lines, and
the semiconductor layer includes an oxide semiconductor.

7. A memory device, comprising:
a plurality of word lines each extending in a first direction
and arranged in a second direction crossing the first
direction;
a plurality of bit lines each extending in the second
direction and arranged in the first direction;
a plurality of transistors, each including a channel that
extends in a third direction crossing the first direction
and the second direction;
a plurality of capacitors each including two electrodes,
one of which is coupled to one end of a corresponding
one of the transistors; and
a plate line to which the other one of the electrodes of each
of the capacitors is coupled,
wherein the transistors include a plurality of first transis-
tors and a plurality of second transistors each included
in a first region, a plurality of third transistors and a
plurality of fourth transistors each included in a second
region, each of the first transistors having a gate end
coupled to a first word line of the word lines, each of
the second transistors having a gate end coupled to a
second word line of the word lines that is adjacent to
the first word line, each of the third transistors having
a gate end coupled to a third word line of the word
lines, each of the fourth transistors having a gate end
coupled to a fourth word line of the word lines that is
adjacent to the third word line, the first transistors and
the second transistors being alternately arranged in the
first direction, and the third transistors and the fourth
transistors being alternately arranged in the first direc-
tion,
the bit lines include first to fourth bit line portions
arranged sequentially in the first direction in the first
region, and fifth to eighth bit line portions arranged
sequentially in the first direction in the second region,
each of the first bit line portion and the third bit line
portion is coupled to the other end of a corresponding
one of the first transistors and to the other end of a
corresponding one of the second transistors, the second
bit line portion is coupled to the other end of a
corresponding one of the first transistors and not
coupled to the other end of any of the second transis-
tors, the fourth bit line portion is coupled to the other
end of a corresponding one of the second transistors
and not coupled to the other end of any of the first
transistors, each of the fifth bit line portion and the
seventh bit line portion is coupled to the other end of a
corresponding one of the third transistors and to the
other end of a corresponding one of the fourth transis-
tors, the sixth bit line portion is coupled to the other end
of a corresponding one of the third transistors and not
coupled the other end of any of the fourth transistors,
and the eighth bit line portion is coupled to the other end of a corresponding one of the fourth transistors and
not coupled to the other end of any of the third
transistors, and
the first bit line portion is coupled to either one of the fifth
bit line portion and the seventh bit line portion, the third
bit line portion is coupled to the other one of the fifth
bit line portion and the seventh bit line portion, the
second bit line portion is coupled to either one of the
sixth bit line portion and the eighth bit line portion, and
the fourth bit line portion is coupled to the other one of
the sixth bit line portion and the eighth bit line portion.

8. The memory device of claim 7, wherein
the bit lines include a first group including the first to
fourth bit line portions and a second group including
the fifth to eighth bit line portions, and each of the first
group and the second group is repeatedly arranged in
the first direction.

9. The memory device of claim 7, wherein
the first to fourth bit line portions are adjacent to the fifth
to eighth bit line portions, respectively, in the second
direction, and
the first bit line portion is coupled to the seventh bit line
portion, the third bit line portion is coupled to the fifth
bit line portion, the second bit line portion is coupled to
the sixth bit line portion, and the fourth bit line portion
is coupled to the eighth bit line portion.

10. The memory device of claim 7, wherein
the first to fourth bit line portions are adjacent to the fifth
to eighth bit line portions, respectively, in the second
direction and
the first bit line portion is coupled to the fifth bit line
portion, the third bit line portion is coupled to the
seventh bit line portion, the second bit line portion is
coupled to the eighth bit line portion, and the fourth bit
line portion is coupled to the sixth bit line portion.

11. The memory device of claim 10, wherein
the transistors include a plurality of fifth transistors and a
plurality of sixth transistors included in a third region,
each of the fifth transistors having a gate end coupled
to a fifth word line of the word lines, each of the sixth
transistors having a gate end coupled to a sixth word
line of the word lines that is adjacent to the fifth word
line, the fifth transistors and the sixth transistors being
arranged in the first direction to alternate each other, the
second region being arranged between the first region
and the third region,
the bit lines include ninth to twelfth bit line portions
arranged sequentially in the first direction in the third
region, each of the ninth bit line portion and the
eleventh bit line portion being coupled to the other end
of a corresponding one of the fifth transistors and to the
other end of a corresponding one of the sixth transis-
tors, the tenth bit line portion being coupled to the other
end of a corresponding one of the fifth transistors and
not coupled to the other end of any of the sixth
transistors, and the twelfth bit line portion being
coupled to the other end of a corresponding one of the
sixth transistors and not coupled to the other end of any
of the fifth transistors,
the fifth to eighth bit line portions are adjacent to the ninth
to twelfth bit line portions, respectively, in the second
direction and
the fifth bit line portion is coupled to the ninth bit line
portion, the sixth bit line portion is coupled to the
twelfth bit line portion, the seventh bit line portion is
coupled to the eleventh bit line portion, and the eighth
bit line portion is coupled to the tenth bit line portion.

12. The memory device of claim 7, wherein the first to fourth bit line portions are adjacent to the fifth to eighth bit line portions, respectively, in the second direction, and the first bit line portion is coupled to the seventh bit line portion, the third bit line portion is coupled to the fifth bit line portion, the second bit line portion is coupled to the eighth bit line portion, and the fourth bit line portion is coupled to the sixth bit line portion.

13. The memory device of claim 12, wherein the transistors include a plurality of fifth transistors and a plurality of sixth transistors included in a third region, each of the fifth transistors having a gate end coupled to a fifth word line of the word lines, each of the sixth transistors having a gate end coupled to a sixth word line of the word lines that is adjacent to the fifth word line, the fifth transistors and the sixth transistors being alternately arranged in the first direction, the second region being arranged between the first region and the third region, the bit lines include ninth to twelfth bit line portions arranged sequentially in the first direction in the third region, each of the ninth bit line portion and the eleventh bit line portion being coupled to the other end of a corresponding one of the fifth transistors and to the other end of a corresponding one of the sixth transistors, the tenth bit line portion being coupled to the other end of a corresponding one of the fifth transistors and not coupled to the other end of any of the sixth transistors, and the twelfth bit line portion being coupled to the other end of a corresponding one of the sixth transistors and not coupled to the other end of any of the fifth transistors, the fifth to eighth bit line portions are adjacent to the ninth to twelfth bit line portions, respectively, in the second direction and the fifth bit line portion is coupled to the eleventh bit line portion, the sixth bit line portion is coupled to the twelfth bit line portion, the seventh bit line portion is coupled to the ninth bit line portion, and the eighth bit line portion is coupled to the tenth bit line portion.

14. The memory device of claim 11, wherein the bit lines include a third group including the ninth to twelfth bit line portions, and the third group is repeatedly arranged in the first direction.

15. The memory device of claim 8, wherein the first to fourth bit line portions are adjacent to the fifth to eighth bit line portions, respectively, in the second direction and in the first group and the second group that are adjacent to each other in the second direction, the first bit line portion is coupled to the fifth bit line portion, the third bit line portion is coupled to the seventh bit line portion, the second bit line portion is coupled to the eighth bit line portion, the fourth bit line portion is coupled to the sixth bit line portion included in the adjacent second group, and an interconnect that couples the second bit line portion and the eighth bit line portion to each other and an interconnect that couples the fourth bit line portion and the sixth bit line portion to each other do not cross each other.

16. The memory device of claim 8, wherein the first to fourth bit line portions are adjacent to the fifth to eighth bit line portions, respectively, in the second direction and in the first group and the second group that are adjacent to each other in the second direction, the first bit line portion is coupled to the seventh bit line portion, the third bit line portion is coupled to the fifth bit line portion included in the adjacent second group, the second bit line portion is coupled to the sixth bit line portion, and the fourth bit line portion is coupled to the eighth bit line portion, and an interconnect that couples the first bit line portion and the seventh bit line portion to each other and an interconnect that couples the third bit line portion and the fifth bit line portion to each other do not cross each other.

17. The memory device of claim 8, wherein in the second group, positions of the fifth bit line portion and the sixth bit line portion are exchanged, and positions of the seventh bit line portion and the eighth bit line portion are exchanged, in the first group and the second group that are adjacent to each other in the second direction, the first to fourth bit line portions are coupled to the fifth to eighth bit line portions, respectively.

18. The memory device of claim 7, further comprising:

an interconnect provided in a fourth region between the first region and second region in a first layer, wherein the bit lines are provided in a second layer, the transistors are provided in a third layer, the second layer is between the first layer and the third layer in the third direction, wherein one of the first to fourth bit line portions and one of the fifth to eighth bit line portions are electrically connected through the interconnect.

19. The memory device of claim 7, further comprising:

an interconnect provided in a fourth region between the first region and the second region at a height where the word lines are provided, wherein one of the first to fourth bit line portions and one of the fifth to eighth bit line portions are electrically connected through the interconnect.

20. The memory device of claim 19, further comprising:

two first contacts each penetrating the interconnect, wherein each of the transistors includes a semiconductor layer extending in the third direction and a gate insulating layer provided between the semiconductor layer and one of the word lines, one of the two first contacts is coupled to one of the first to fourth bit line portions, and the other one of the two first contacts is coupled to one of the fifth to eighth bit line portions, a bottom surface of each of the first contacts is at a same height as a bottom surface of the semiconductor layer, and a top surface of each of the first contacts is at a same height as a top surface of the semiconductor layer, and the first contacts include a conductor that differs from the semiconductor layer.

21. The memory device of claim 19, further comprising:

two first contacts each penetrating the interconnect, wherein each of the transistors includes a semiconductor layer extending in the third direction and a gate insulating layer provided between the semiconductor layer and one of the word lines, one of the two first contacts is coupled to one of the first to fourth bit line portions, and the other one of the two first contacts is coupled to one of the fifth to eighth bit line portions, a bottom surface of each of the first contacts is at a same height as a bottom surface of the semiconductor layer, and a top surface of each of the first contacts is at a same height as a top surface of the semiconductor layer, and the first contacts include a same material as that of the semiconductor layer.

22. The memory device of claim 19, further comprising:

two first contacts each penetrating the interconnect; and at least one dummy capacitor provided in the fourth region at a same height as the capacitors, wherein each of the transistors includes a semiconductor layer extending in the third direction and a gate insulating layer provided between the semiconductor layer and one of the word lines, one of the two first contacts is coupled to one of the first to fourth bit line portions, and the other one of the two first contacts is coupled to one of the fifth to eighth bit line portions, and a bottom surface of each of the first contacts is at a position higher than a top surface of the dummy capacitor, and a top surface of each of the first contacts is at a same height as a top surface of the semiconductor layer.

* * * * *